US011961886B2

(12) United States Patent
Wang et al.

(10) Patent No.: US 11,961,886 B2
(45) Date of Patent: *Apr. 16, 2024

(54) SEMICONDUCTOR STRUCTURE WITH CONDUCTIVE STRUCTURE

(71) Applicant: Taiwan Semiconductor Manufacturing Company, Ltd., Hsinchu (TW)

(72) Inventors: Jia-Heng Wang, Kaohsiung (TW); Pang-Chi Wu, Hsinchu (TW); Chao-Hsun Wang, Chung-Li (TW); Fu-Kai Yang, Hsinchu (TW); Mei-Yun Wang, Hsin-Chu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/978,409

(22) Filed: Nov. 1, 2022

(65) Prior Publication Data

US 2023/0049010 A1 Feb. 16, 2023

Related U.S. Application Data

(63) Continuation of application No. 17/325,419, filed on May 20, 2021, now Pat. No. 11,527,614.

(Continued)

(51) Int. Cl.
*H01L 29/06* (2006.01)
*H01L 21/8234* (2006.01)

(52) U.S. Cl.
CPC .. *H01L 29/0673* (2013.01); *H01L 21/823418* (2013.01); *H01L 21/823475* (2013.01)

(58) Field of Classification Search
CPC ........... H01L 29/42392; H01L 29/0653; H01L 29/78696; H01L 21/823475;
(Continued)

(56) References Cited

U.S. PATENT DOCUMENTS 9,209,247 B2 12/2015 Colinge et al.
9,236,267 B2 1/2016 De et al.
(Continued)

FOREIGN PATENT DOCUMENTS

DE 10 2019 117 925 A1 4/2020
JP 2019-102797 A 6/2019
(Continued)

OTHER PUBLICATIONS

Korean Notice of Allowance for Korean Application No. 10-2021-0093072, dated Jan. 31, 2024, with partial English translation.

Primary Examiner — Changhyun Yi
(74) Attorney, Agent, or Firm — Birch, Stewart, Kolasch & Birch, LLP

(57) ABSTRACT

Semiconductor structures and methods for manufacturing the same are provided. The semiconductor structure includes a substrate and nanostructures suspended over the substrate. The semiconductor structure also includes a gate structure wrapping around the nanostructures and a source/drain structure attached to the nanostructures. The semiconductor structure also includes a contact vertically over the source/drain structure and a first conductive structure vertically over the gate structure. The semiconductor structure also includes a second conductive structure in contact with a top surface of the first conductive structure and a top surface of the contact and including an extending portion laterally sandwiched between the first conductive structure and the contact.

20 Claims, 29 Drawing Sheets

Related U.S. Application Data

(60) Provisional application No. 63/158,489, filed on Mar. 9, 2021.

(58) Field of Classification Search
CPC ......... H01L 21/823418; H01L 29/0673; H01L 23/5226; H01L 23/485; H01L 21/76831; H01L 21/76883; H01L 23/5283
See application file for complete search history.

(56) References Cited

U.S. PATENT DOCUMENTS

| | | |
|---|---|---|
| 9,349,812 B2 | 5/2016 | Chen et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,837,414 B1 | 12/2017 | Balakrishnan et al. |
| 9,847,390 B1 | 12/2017 | Xie et al. |
| 10,770,388 B2 | 9/2020 | Xie et al. |
| 11,527,614 B2 * | 12/2022 | Wang ................ H01L 21/76895 |
| 2014/0077305 A1 | 3/2014 | Pethe et al. |
| 2018/0053721 A1 | 2/2018 | Adusumilli et al. |
| 2018/0096935 A1 | 4/2018 | Kim et al. |
| 2019/0287851 A1 | 9/2019 | Chen et al. |
| 2019/0385946 A1 | 12/2019 | Xie et al. |
| 2020/0075574 A1 * | 3/2020 | Smith ................ H01L 29/0692 |
| 2020/0091288 A1 | 3/2020 | Lee et al. |
| 2020/0321244 A1 | 10/2020 | Fan et al. |
| 2020/0350421 A1 | 11/2020 | Khaderbad et al. |
| 2020/0381299 A1 | 12/2020 | You et al. |
| 2021/0066125 A1 | 3/2021 | Li et al. |
| 2022/0199775 A1 | 6/2022 | Park et al. |

FOREIGN PATENT DOCUMENTS

| | | |
|---|---|---|
| KR | 10-2018-0134158 A | 12/2018 |
| KR | 10-2020-0020631 A | 2/2020 |
| KR | 10-2021-0012084 A | 2/2021 |
| KR | 10-2021-0024405 A | 3/2021 |

* cited by examiner

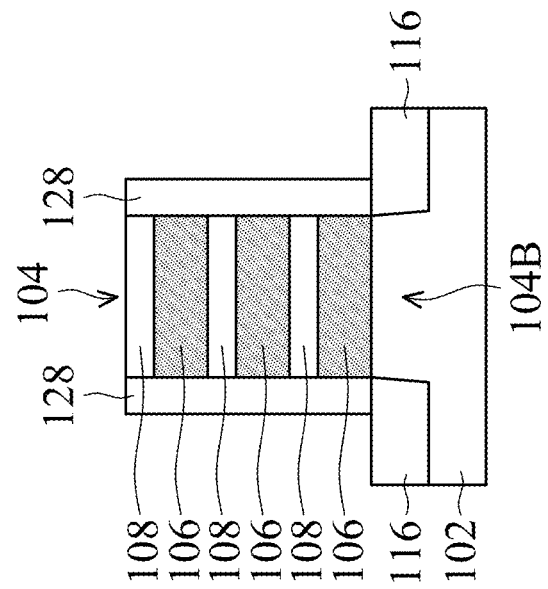
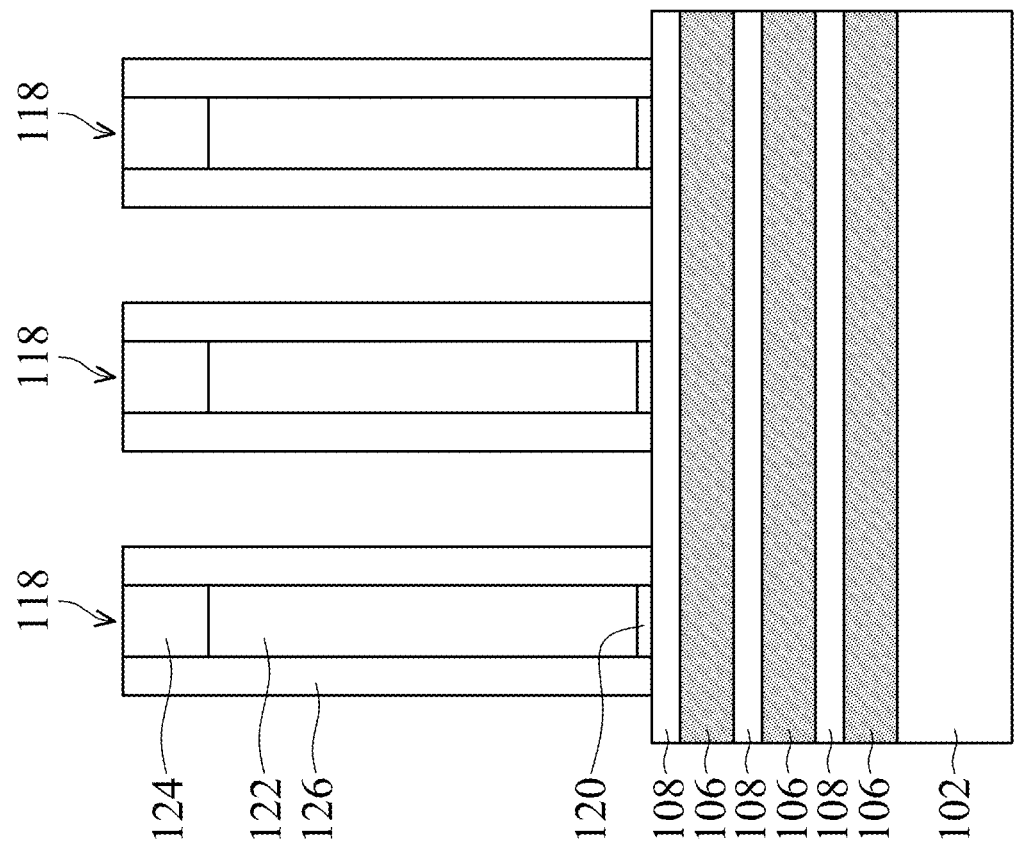
FIG. 2A-1
FIG. 2A-2

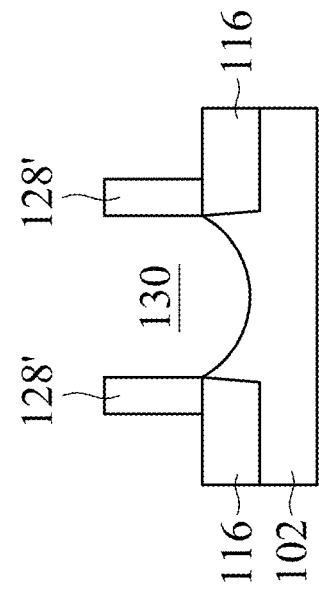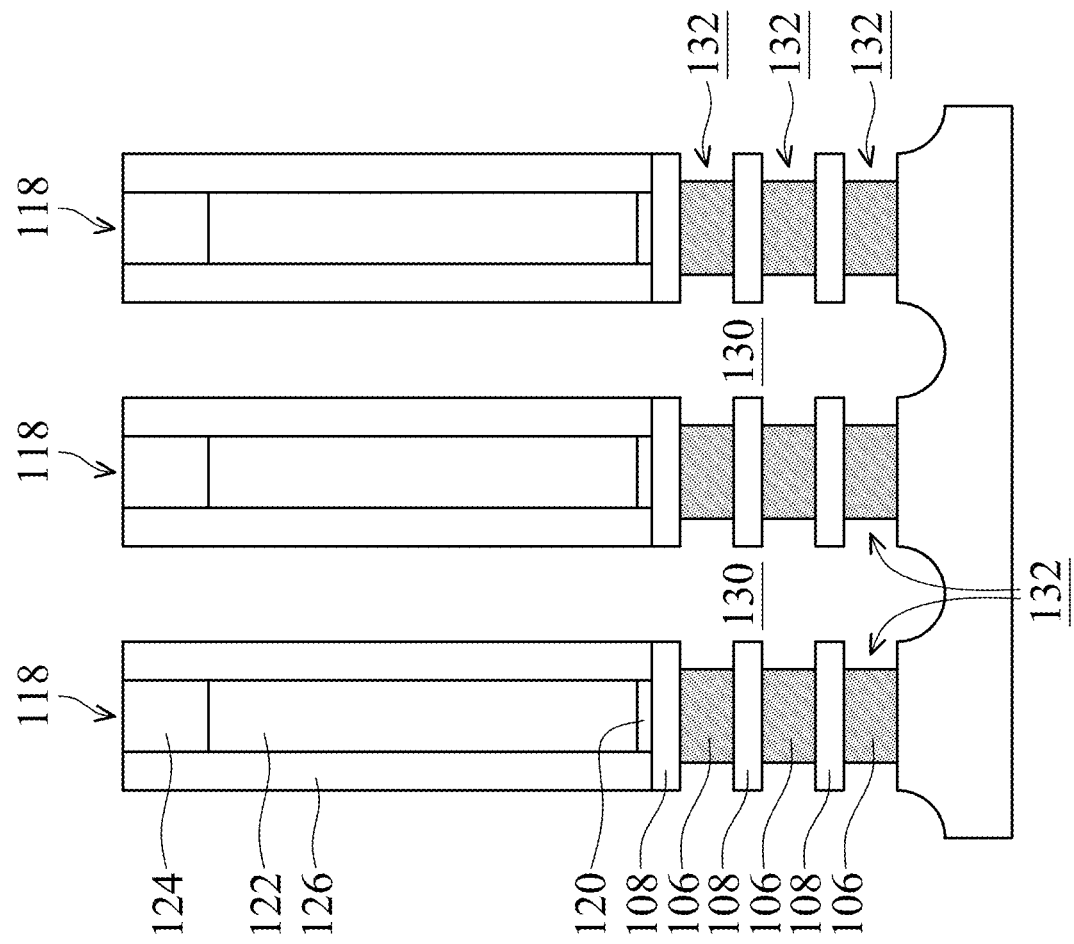

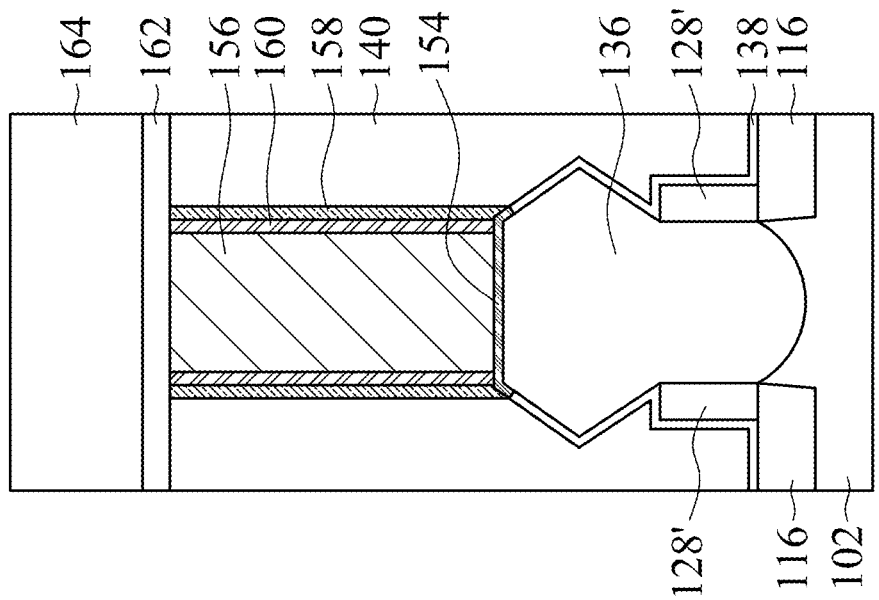
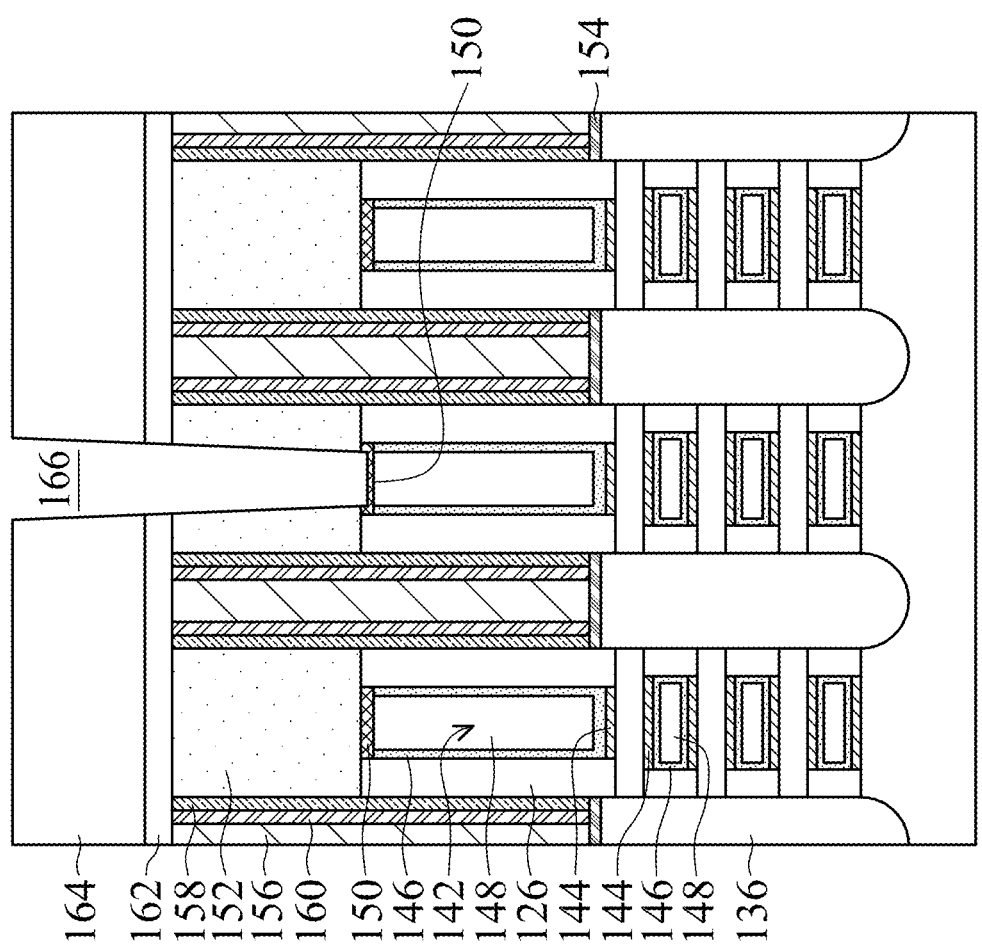
FIG. 2J-2
FIG. 2J-1

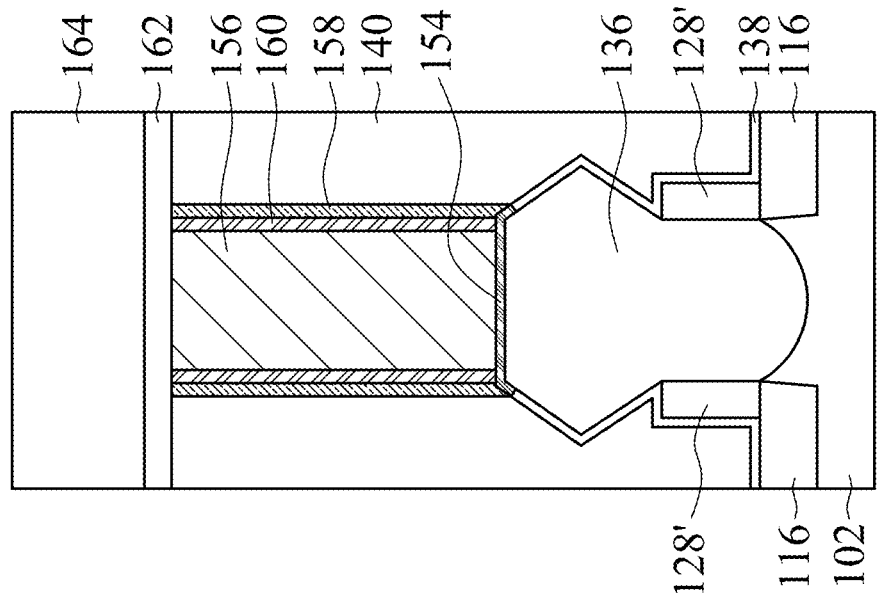
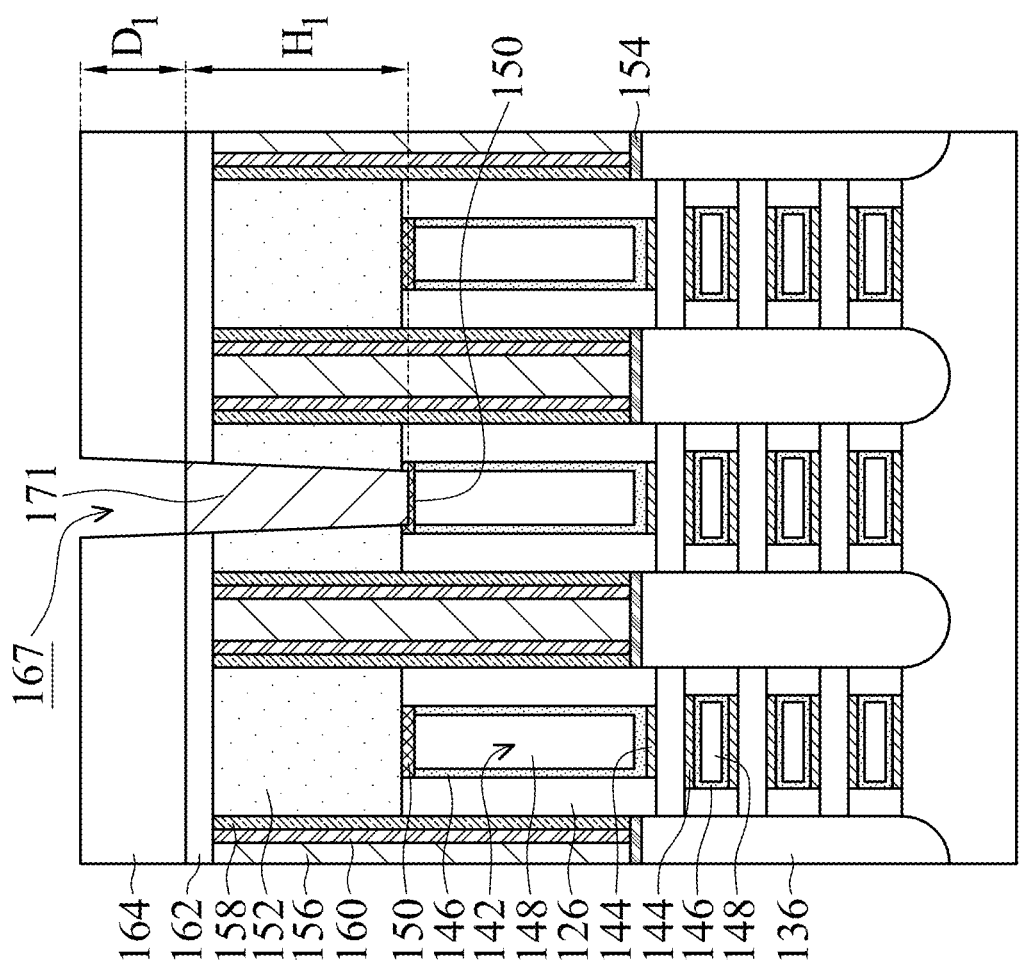
FIG. 2M-2
FIG. 2M-1

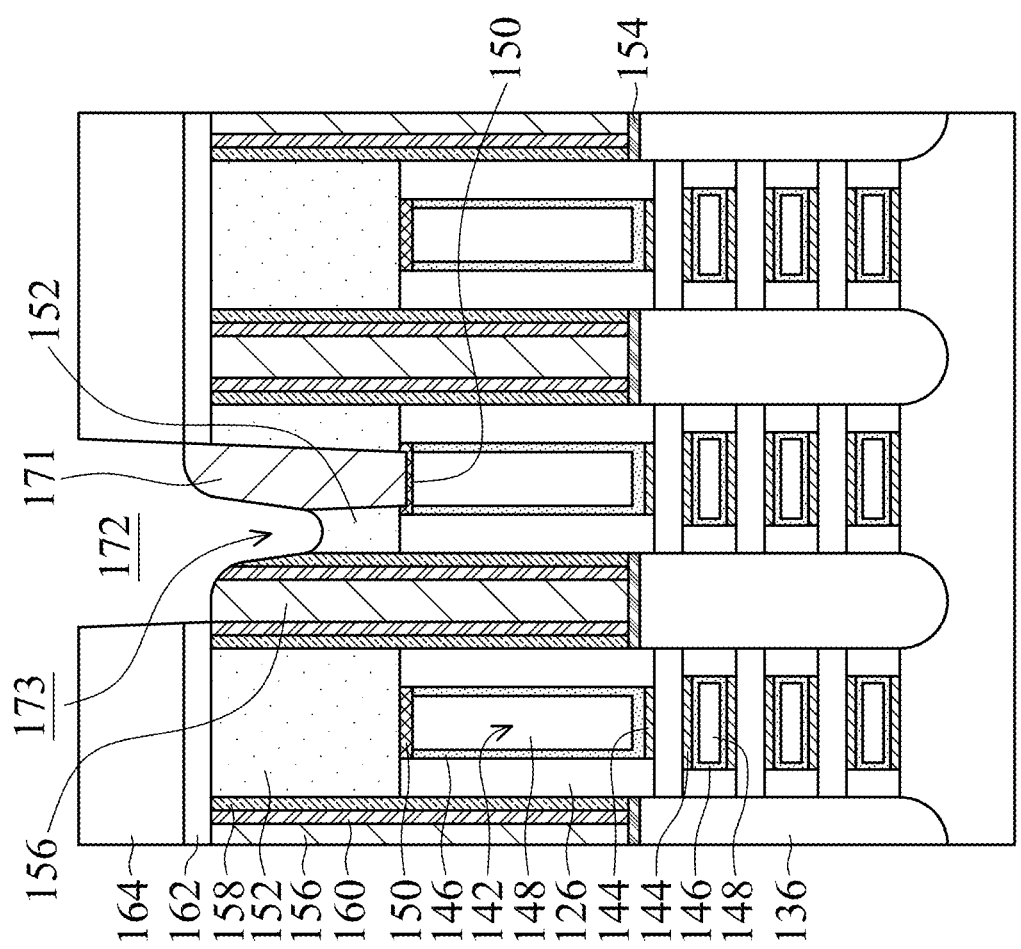
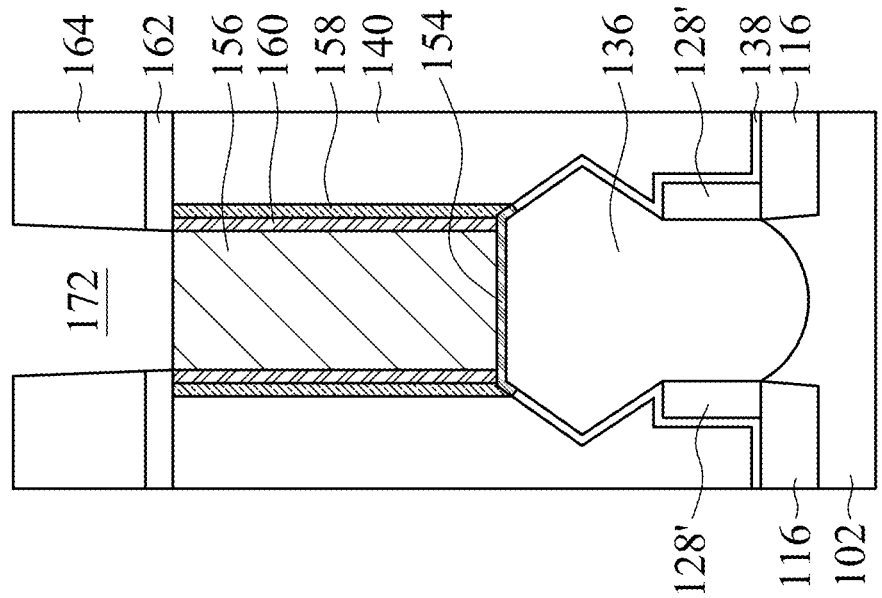
FIG. 2N-1
FIG. 2N-2

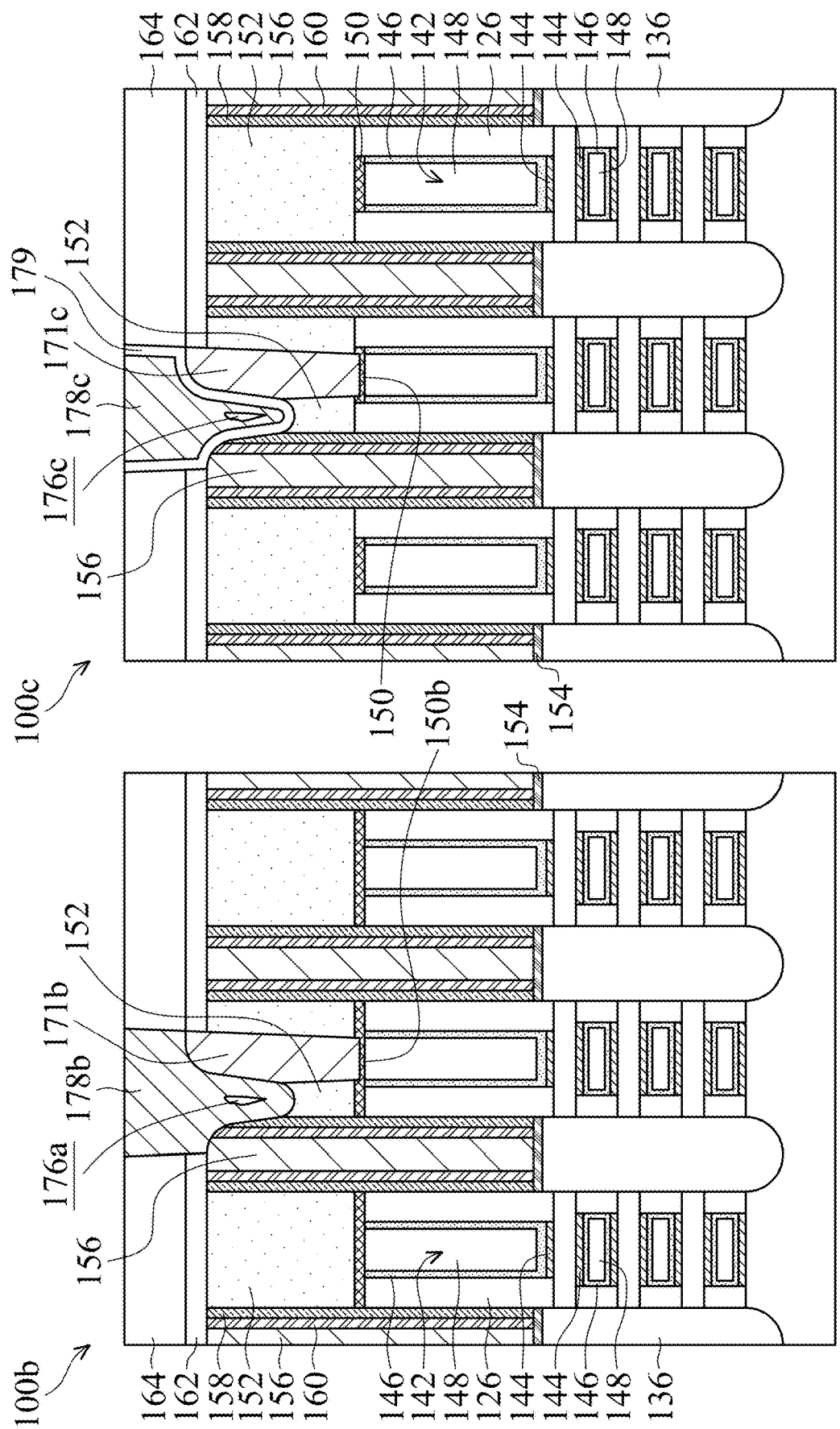

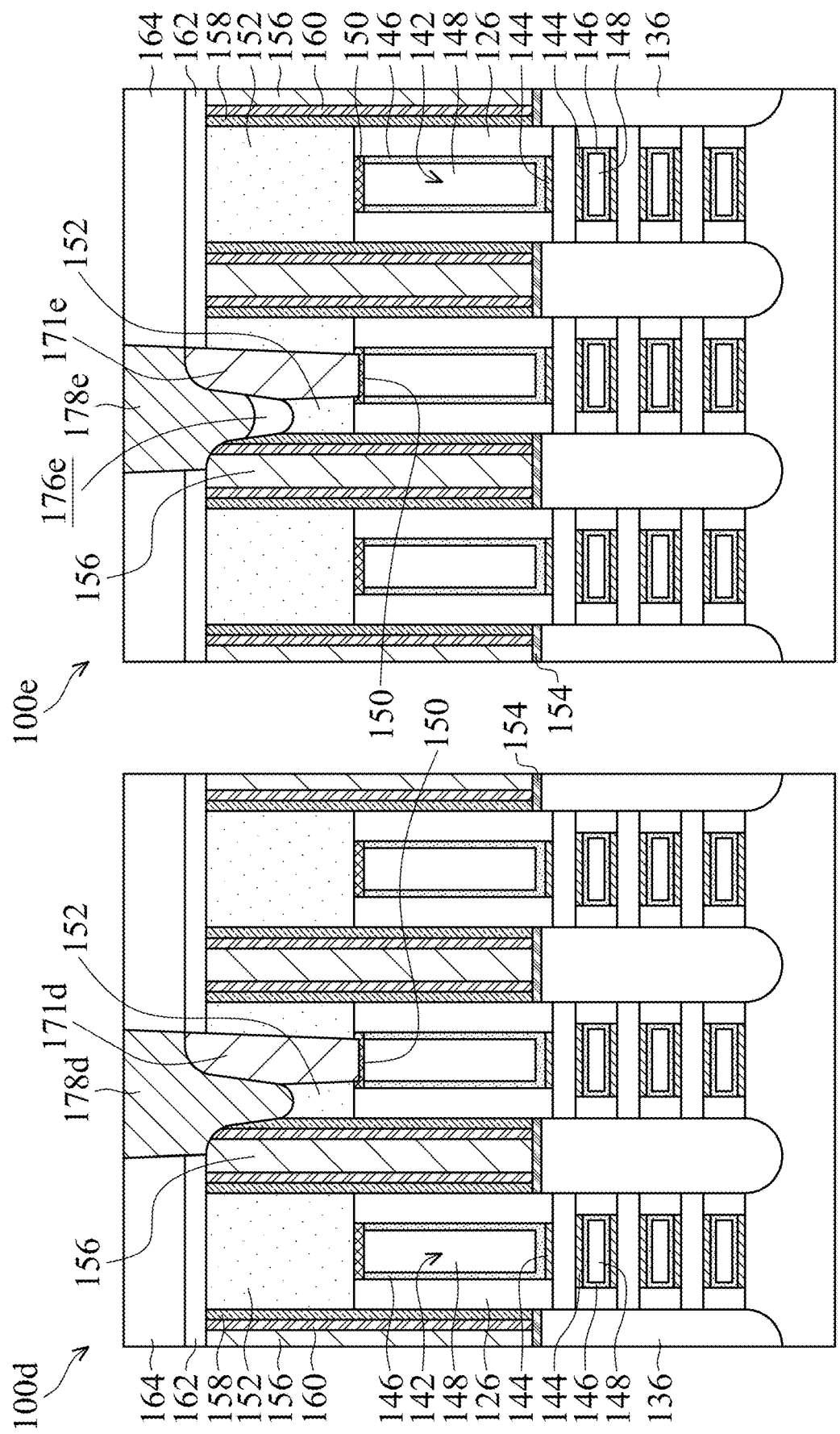

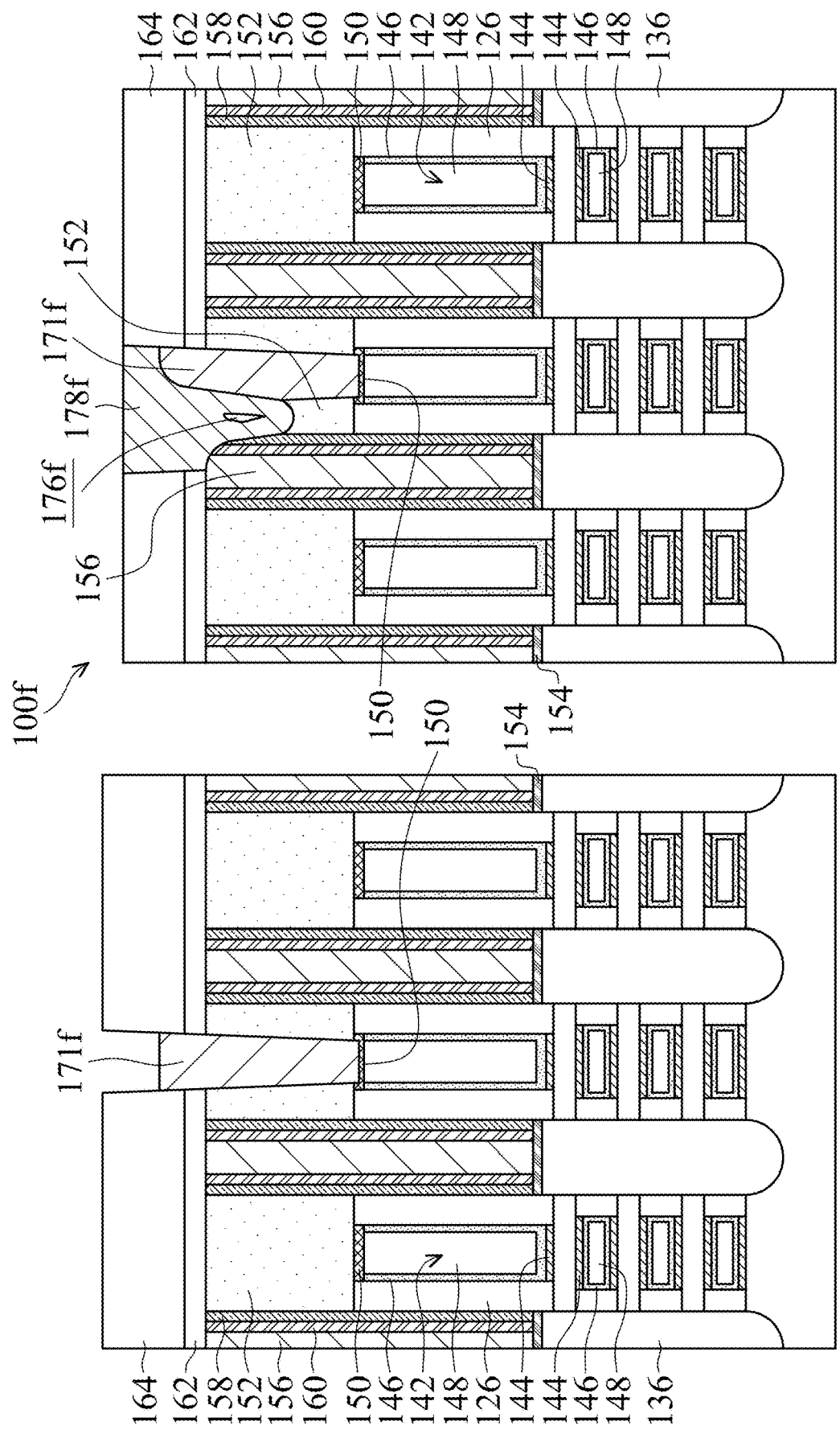

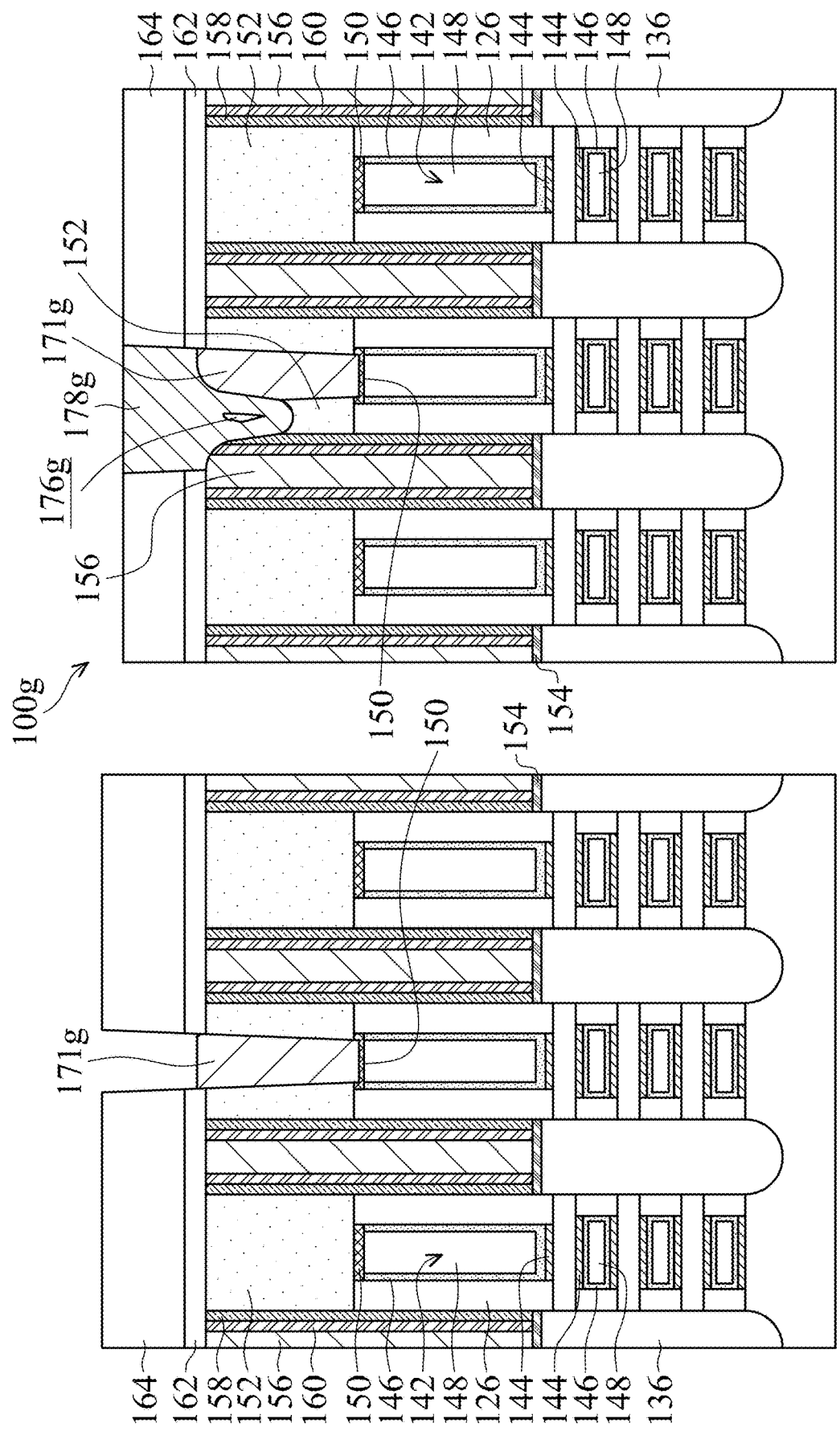

SEMICONDUCTOR STRUCTURE WITH CONDUCTIVE STRUCTURE

PRIORITY CLAIM AND CROSS-REFERENCE

This application is a Continuation application of U.S. patent application Ser. No. 17/325,419, filed on May 20, 2021, which this application claims the benefit of U.S. Provisional Application No. 63/158,489, filed on Mar. 9, 2021, the entirety of which is incorporated by reference herein.

BACKGROUND

The electronics industry is experiencing ever-increasing demand for smaller and faster electronic devices that are able to perform a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). However, integration of fabrication of the multi-gate devices can be challenging.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

FIGS. 2A-1 to 2P-1 illustrate cross-sectional representations of various stages of manufacturing the semiconductor structure shown along line A-A' in FIG. 1E in accordance with some embodiments.

FIGS. 2A-2 to 2P-2 illustrate cross-sectional representations of various stages of manufacturing the semiconductor structure shown along line B-B' in FIG. 1E in accordance with some embodiments.

FIGS. 6A-1, 6A-2, 6B-1, and 6B-2 illustrate cross-sectional views of manufacturing a semiconductor structure in accordance with some embodiments.

FIG. 7 illustrates a cross-sectional view of a semiconductor structure in accordance with some embodiments.

FIG. 8 illustrates a cross-sectional view of a semiconductor structure in accordance with some embodiments.

FIG. 9 illustrates a cross-sectional view of a semiconductor structure in accordance with some embodiments.

FIG. 10 illustrates a cross-sectional view of a semiconductor structure 100e in accordance with some embodiments.

FIGS. 11A and 11B illustrate cross-sectional views of manufacturing a semiconductor structure in accordance with some embodiments.

FIGS. 12A and 12B illustrate cross-sectional views of manufacturing a semiconductor structure in accordance with some embodiments.

DETAILED DESCRIPTION

Figure 1A:
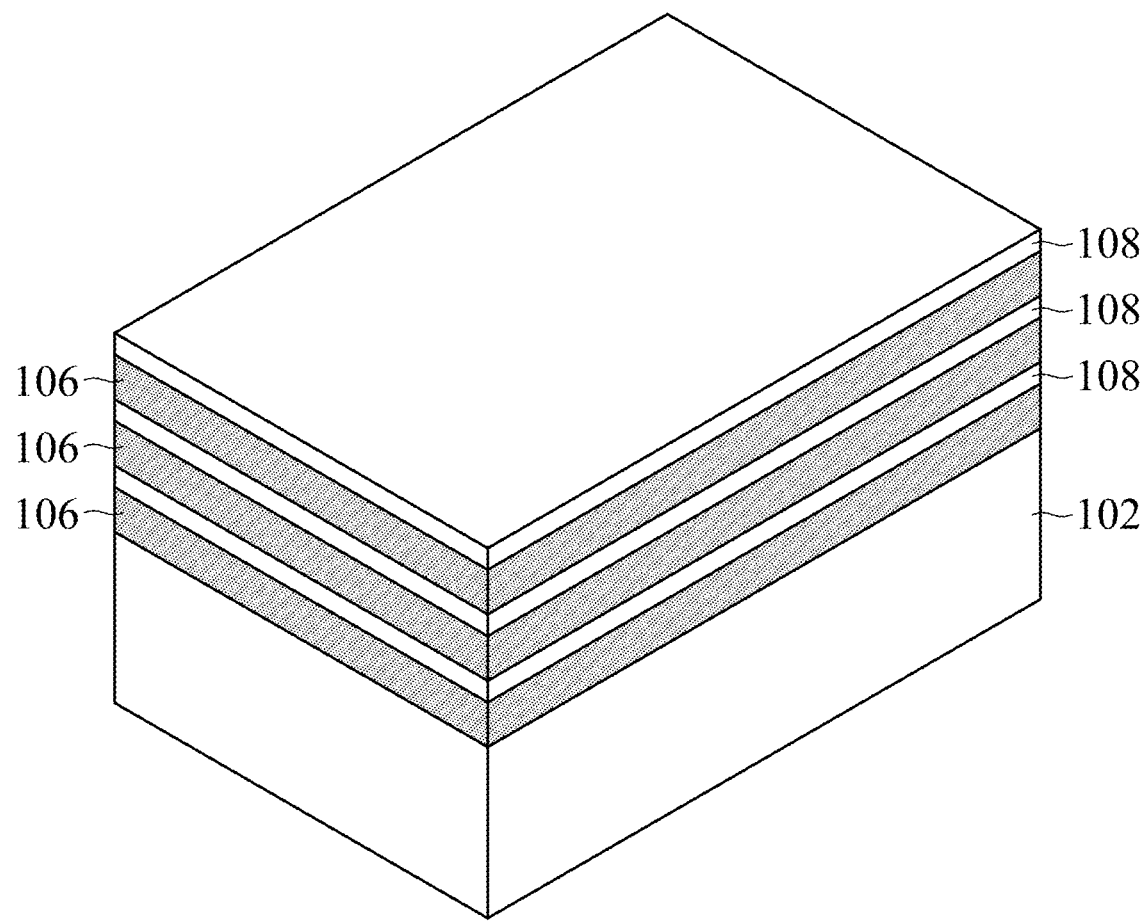
FIGS. 1A to 1E illustrate perspective views of intermediate stages of manufacturing a semiconductor structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The fins described below may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Embodiments of semiconductor structures and methods for forming the same are provided. The semiconductor structures may include a gate structure formed over a substrate and a source/drain structure formed adjacent to the gate structure. A contact may be formed over the source/drain structure and a conductive structure may be formed to connect the contact and the gate structure. Since the contact and the gate structure may have different heights, the formation of the conductive structure may include forming a first portion over the gate structure first and then forming a second portion over the first portion and the contact. The first portion of the conductive structure formed over the gate structure may have a relatively small height difference with the contact, so that disconnection between the gate structure and the contact due to large height difference can be prevented.

FIGS. 1A to 1E illustrate perspective views of intermediate stages of manufacturing a semiconductor structure 100 in accordance with some embodiments. As shown in FIG. 1A, first semiconductor material layers 106 and second semiconductor material layers 108 are formed over a substrate 102 in accordance with some embodiments.

The substrate 102 may be a semiconductor wafer such as a silicon wafer. Alternatively or additionally, the substrate 102 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP.

In some embodiments, the first semiconductor material layers 106 and the second semiconductor material layers 108 are alternately stacked over the substrate 102. In some embodiment, the first semiconductor material layers 106 and the second semiconductor material layers 108 are made of different semiconductor materials. In some embodiments, the first semiconductor material layers 106 are made of SiGe, and the second semiconductor material layers 108 are made of silicon. It should be noted that although three first semiconductor material layers 106 and three second semiconductor material layers 108 are formed, the semiconductor structure may include more or fewer first semiconductor material layers 106 and second semiconductor material layers 108. For example, the semiconductor structure may include two to five of the first semiconductor material layers 106 and the second semiconductor material layers.

The first semiconductor material layers 106 and the second semiconductor material layers 108 may be formed by using low-pressure chemical vapor deposition (LPCVD), epitaxial growth process, another suitable method, or a combination thereof. In some embodiments, the epitaxial growth process includes molecular beam epitaxy (MBE), metal organic chemical vapor deposition (MOCVD), or vapor phase epitaxy (VPE).

Figure 1B:
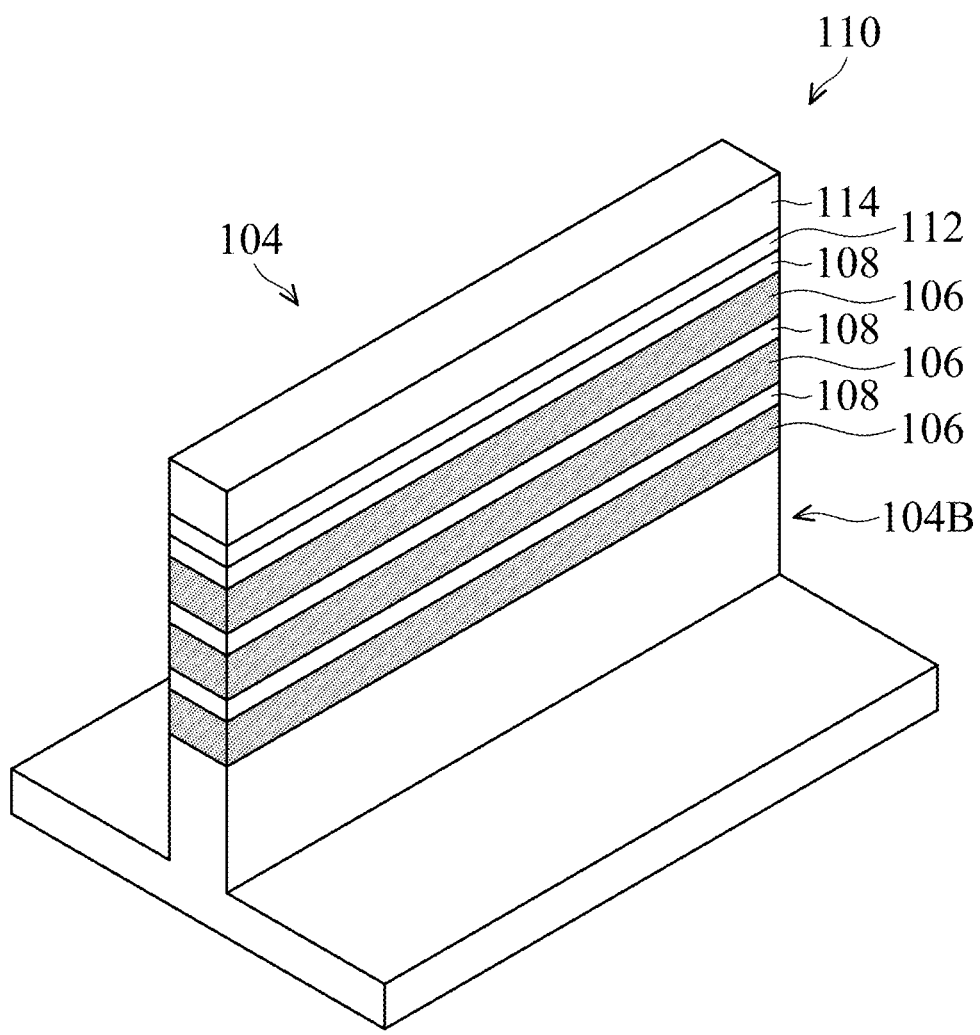

After the first semiconductor material layers 106 and the second semiconductor material layers 108 are formed as a semiconductor material stack over the substrate 102, the semiconductor material stack is patterned to form a fin structure 104, as shown in FIG. 1B in accordance with some embodiments. In some embodiments, the fin structure 104 includes a base fin structure 104B and the semiconductor material stack of the first semiconductor material layers 106 and the second semiconductor material layers 108.

In some embodiments, the patterning process includes forming a mask structure 110 over the semiconductor material stack, and etching the semiconductor material stack and the underlying substrate 102 through the mask structure 110. In some embodiments, the mask structure 110 is a multilayer structure including a pad oxide layer 112 and a nitride layer 114 formed over the pad oxide layer 112. The pad oxide layer 112 may be made of silicon oxide, which is formed by thermal oxidation or CVD, and the nitride layer 114 may be made of silicon nitride, which is formed by CVD, such as LPCVD or plasma-enhanced CVD (PECVD).

Figure 1C:
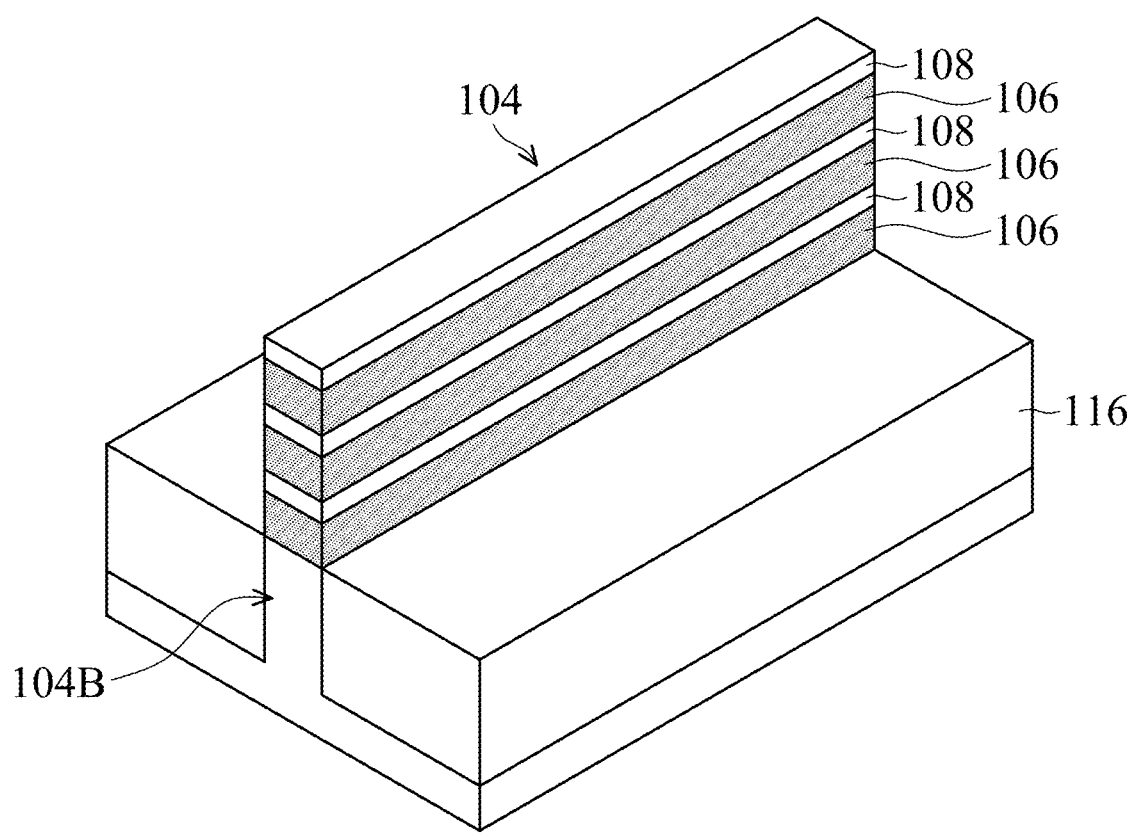

After the fin structure 104 is formed, an isolation structure 116 is formed around the fin structure 104, and the mask structure 110 is removed, as shown in FIG. 1C in accordance with some embodiments. The isolation structure 116 is configured to electrically isolate active regions (e.g. the fin structure 104) of the semiconductor structure 100 and is also referred to as shallow trench isolation (STI) feature in accordance with some embodiments.

The isolation structure 116 may be formed by depositing an insulating layer over the substrate 102 and recessing the insulating layer so that the fin structure 104 is protruded from the isolation structure 116. In some embodiments, the isolation structure 116 is made of silicon oxide, silicon nitride, silicon oxynitride (SiON), another suitable insulating material, or a combination thereof. In some embodiments, a dielectric liner (not shown) is formed before the isolation structure 116 is formed, and the dielectric liner is made of silicon nitride and the isolation structure formed over the dielectric liner is made of silicon oxide.

Figure 1D:
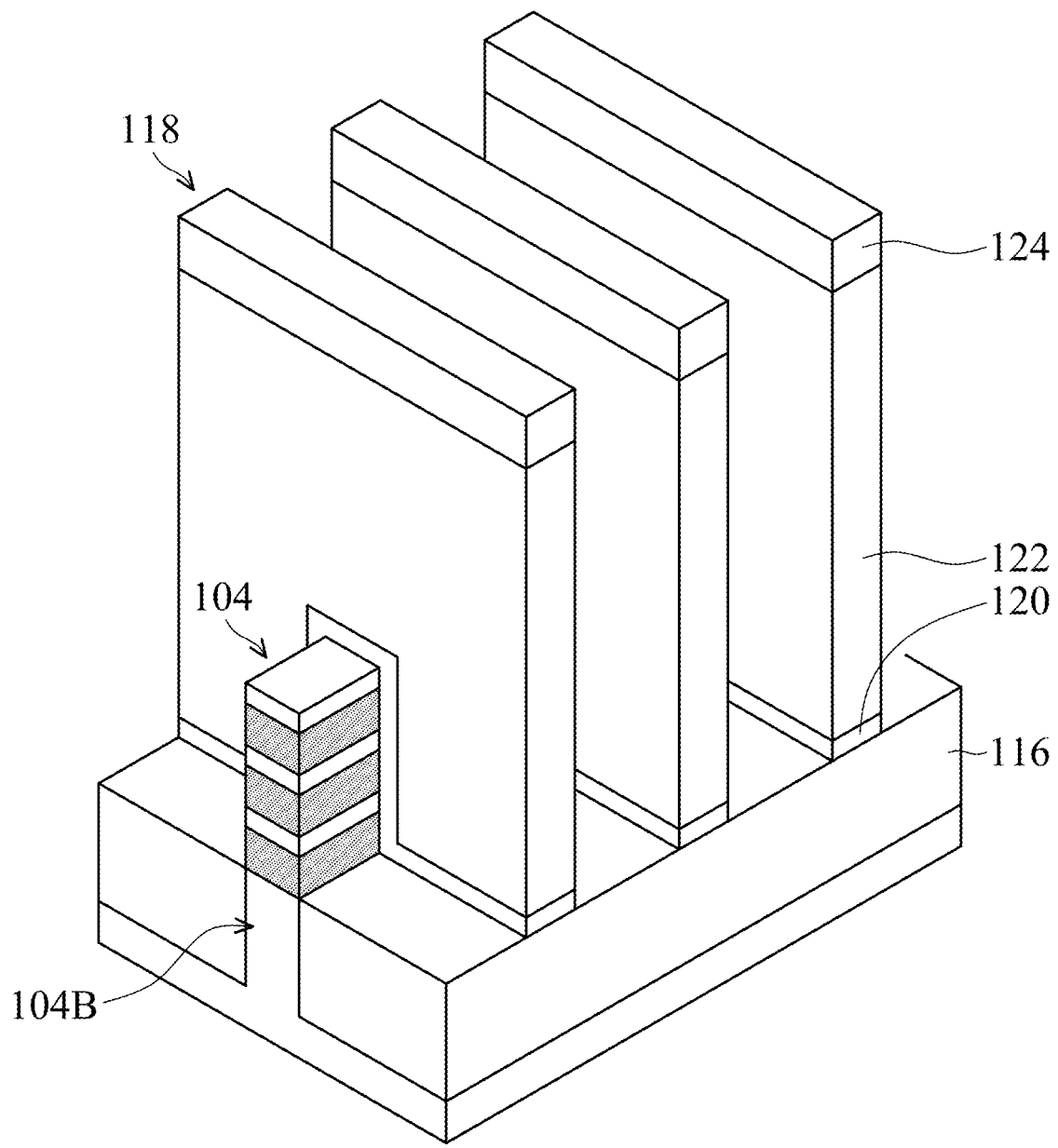

After the isolation structure 116 is formed, dummy gate structures 118 are formed across the fin structure 104 and extend over the isolation structure 116, as shown in FIG. 1D in accordance with some embodiments. The dummy gate structures 118 may be used to define the source/drain regions and the channel regions of the resulting semiconductor structure 100.

In some embodiments, the dummy gate structures 118 include dummy gate dielectric layers 120 and dummy gate electrode layers 122. In some embodiments, the dummy gate dielectric layers 120 are made of one or more dielectric materials, such as silicon oxide, silicon nitride, silicon oxynitride (SiON), $HfO_2$, HfZrO, HfSiO, HfTiO, HfAlO, or a combination thereof. In some embodiments, the dummy gate dielectric layers 120 are formed using thermal oxidation, CVD, ALD, physical vapor deposition (PVD), another suitable method, or a combination thereof.

In some embodiments, the conductive material includes polycrystalline-silicon (poly-Si), poly-crystalline silicon-germanium (poly-SiGe), metallic nitrides, metallic silicides, metals, or a combination thereof. In some embodiments, the dummy gate electrode layers 122 are formed using CVD, PVD, or a combination thereof.

In some embodiments, hard mask layers 124 are formed over the dummy gate structures 118. In some embodiments, the hard mask layers 124 include multiple layers, such as an oxide layer and a nitride layer. In some embodiments, the oxide layer is silicon oxide, and the nitride layer is silicon nitride.

The formation of the dummy gate structures 118 may include conformally forming a dielectric material as the dummy gate dielectric layers 120. Afterwards, a conductive material may be formed over the dielectric material as the dummy gate electrode layers 122, and the hard mask layer 124 may be formed over the conductive material. Next, the dielectric material and the conductive material may be patterned through the hard mask layer 124 to form the dummy gate structures 118.

Figure 1E:
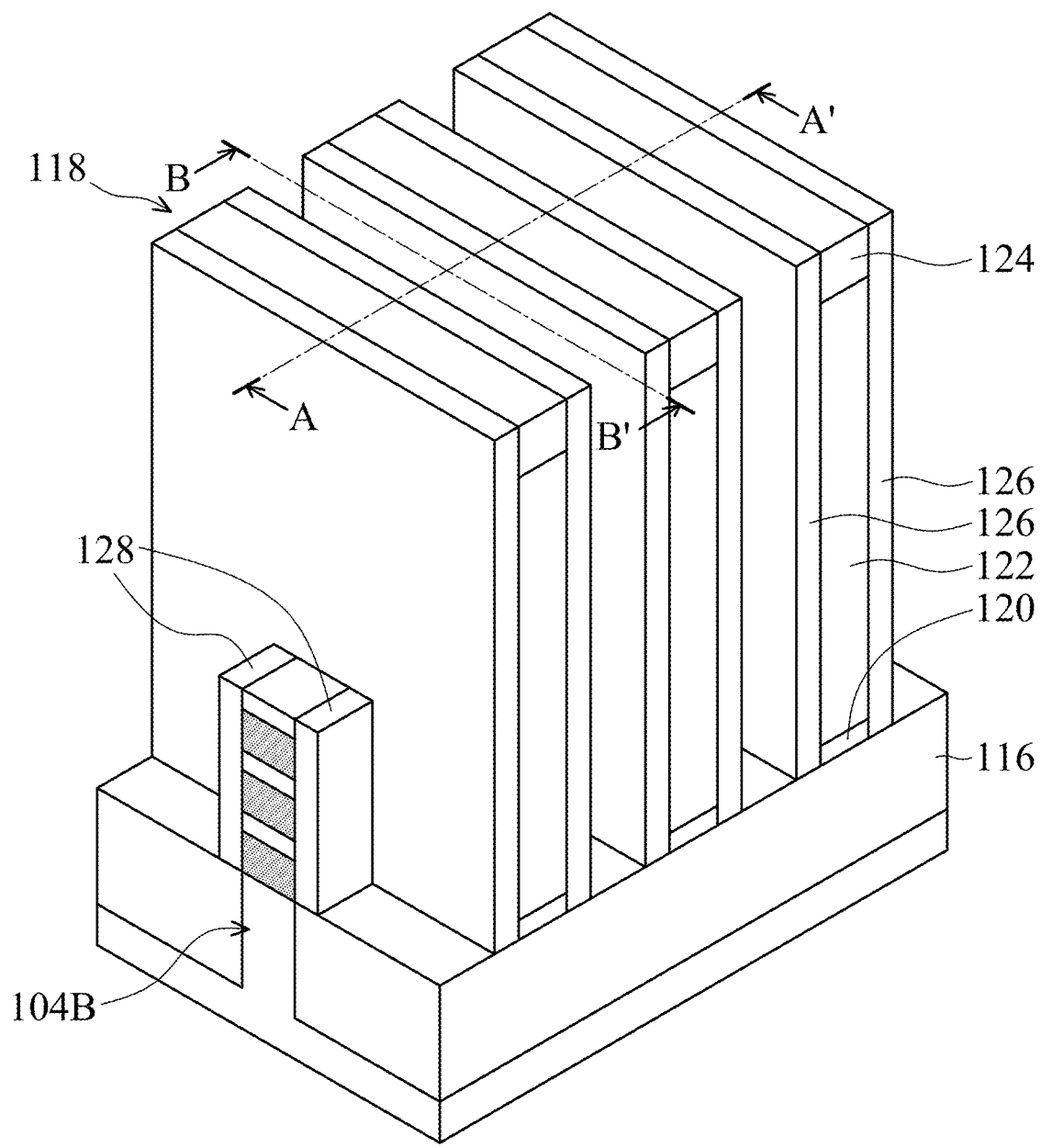

After the dummy gate structures 118 are formed, gate spacers 126 are formed along and covering opposite sidewalls of the dummy gate structure 118 and fin spacers 128 are formed along and covering opposite sidewalls of the source/drain regions of the fin structure 104, as shown in FIG. 1E in accordance with some embodiments.

The gate spacers 126 may be configured to separate source/drain structures from the dummy gate structure 118 and support the dummy gate structure 118, and the fin spacers 128 may be configured to constrain a lateral growth of subsequently formed source/drain structure and support the fin structure 104.

In some embodiments, the gate spacers 126 and the fin spacers 128 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof. The formation of the gate spacers 126 and the fin spacers 128 may include conformally depositing a dielectric material covering the dummy gate structure 118, the fin structure 104, and the isolation structure 116 over the substrate 102, and performing an anisotropic etching process, such as dry plasma etching, to remove the dielectric layer covering the top surfaces of the dummy gate structure 118, the fin structure 104, and portions of the isolation structure 116.

Figures 2, 2B:
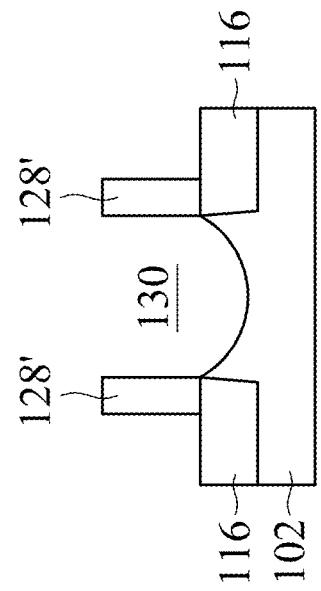
Figures 1, 2B:
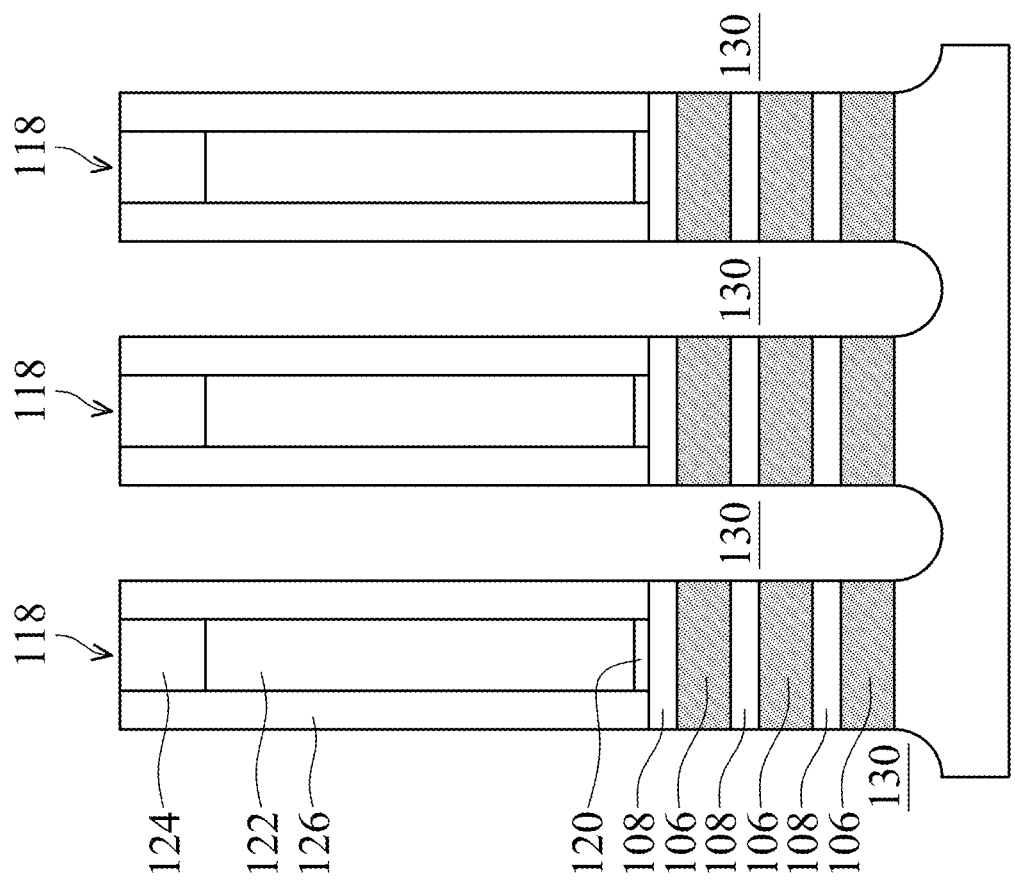
Figures 2, 2D:
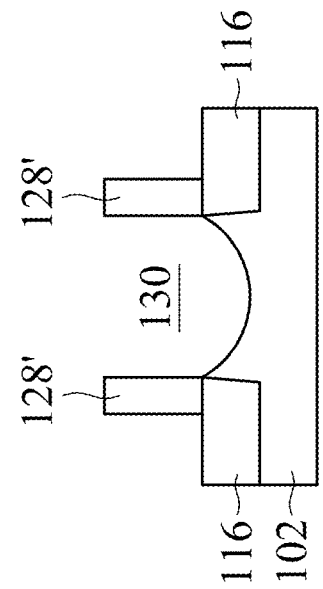
Figures 1, 2D:
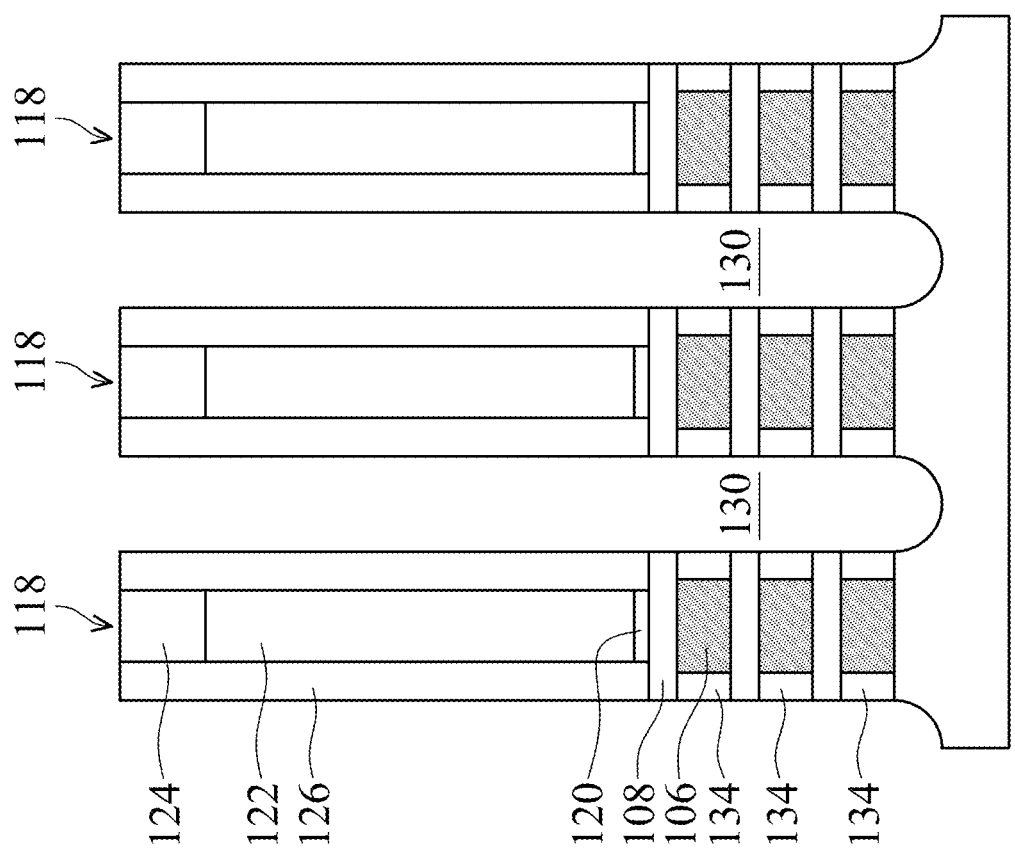
Figures 2, 2E:
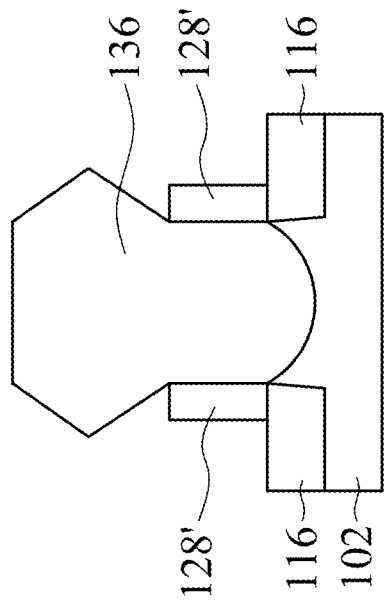
Figures 1, 2E:
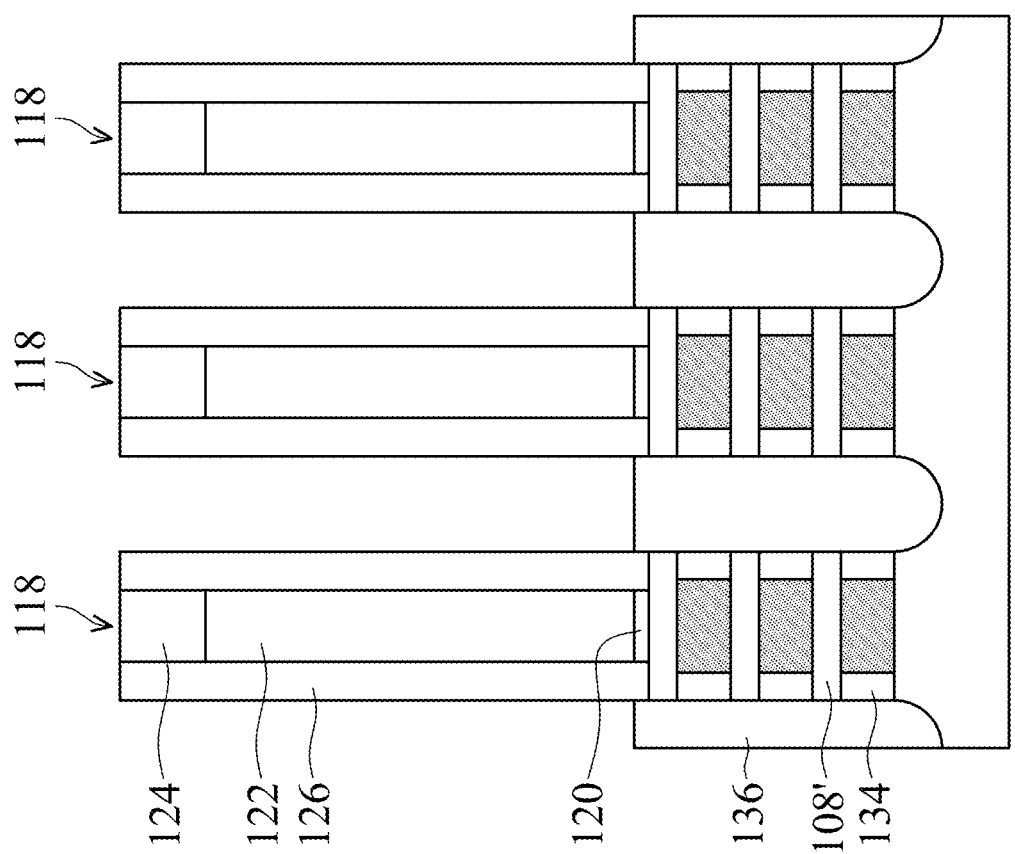
Figures 2, 2F:
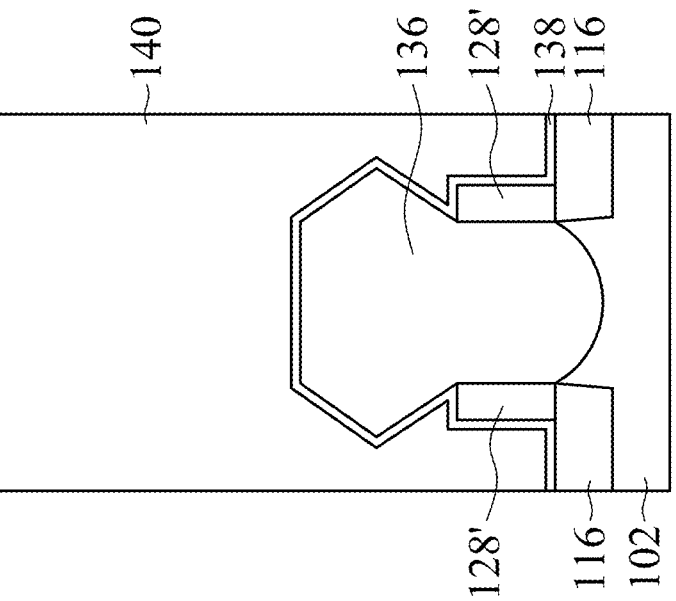
Figures 1, 2F:
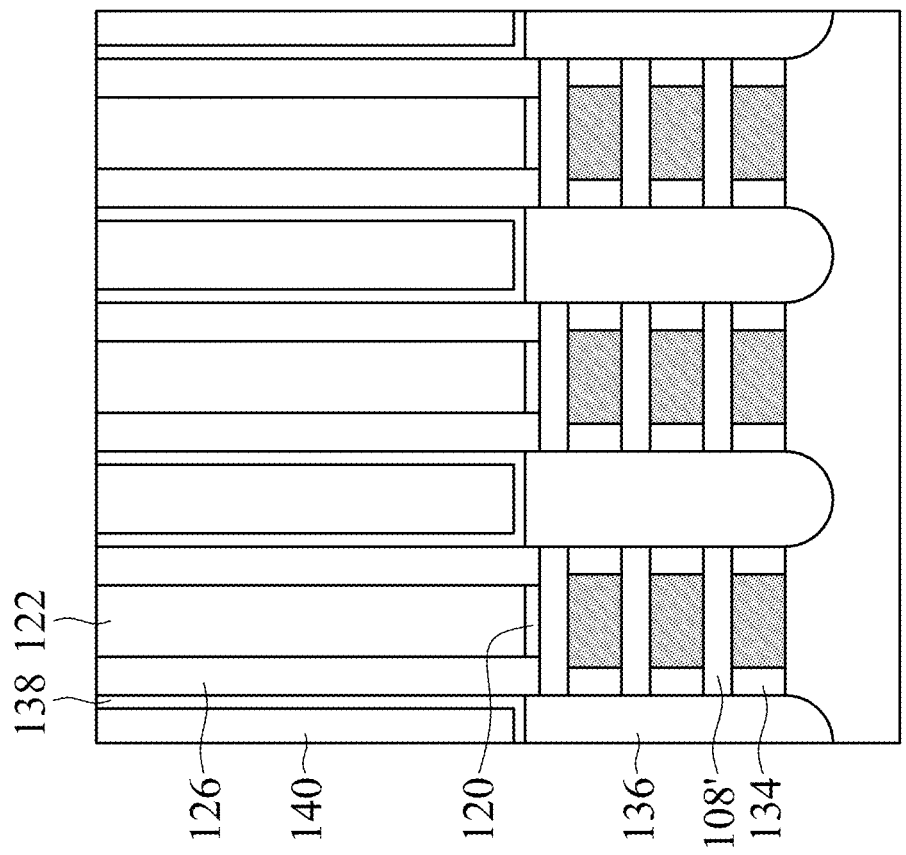
Figures 2, 2G:
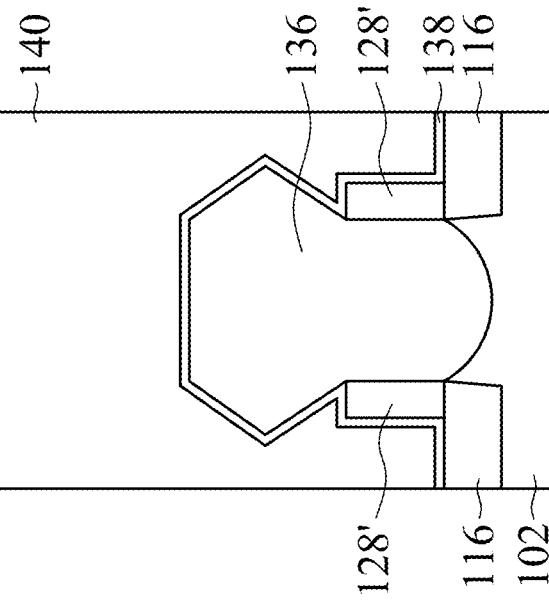
Figures 1, 2G:
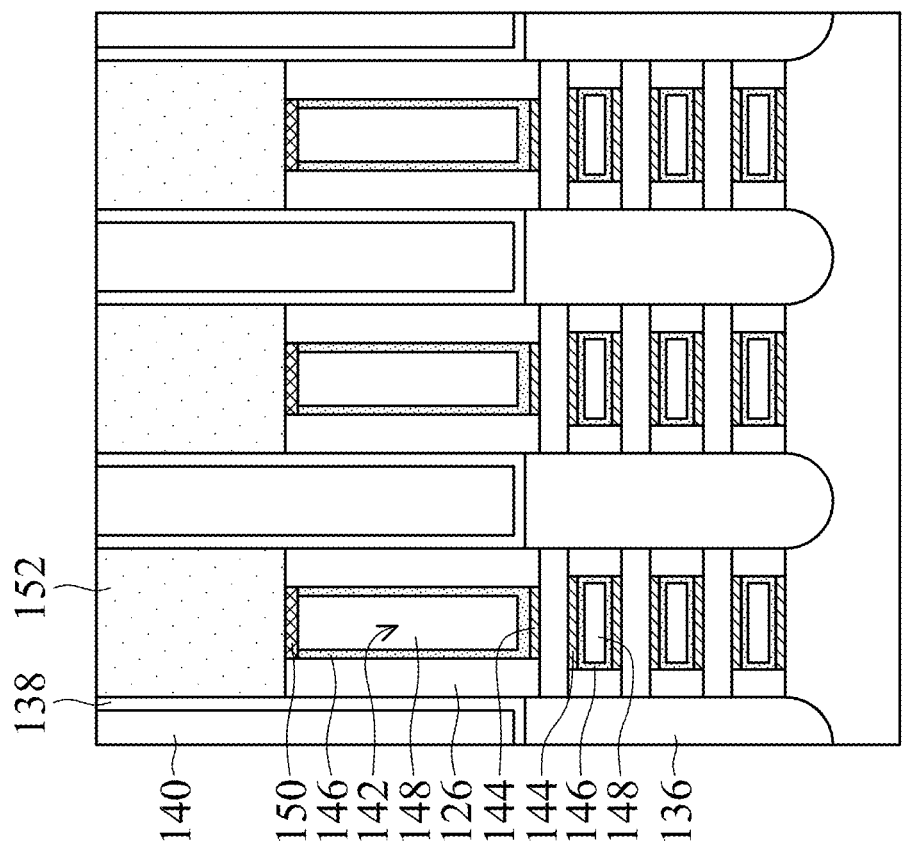
Figures 1, 2, 2H:
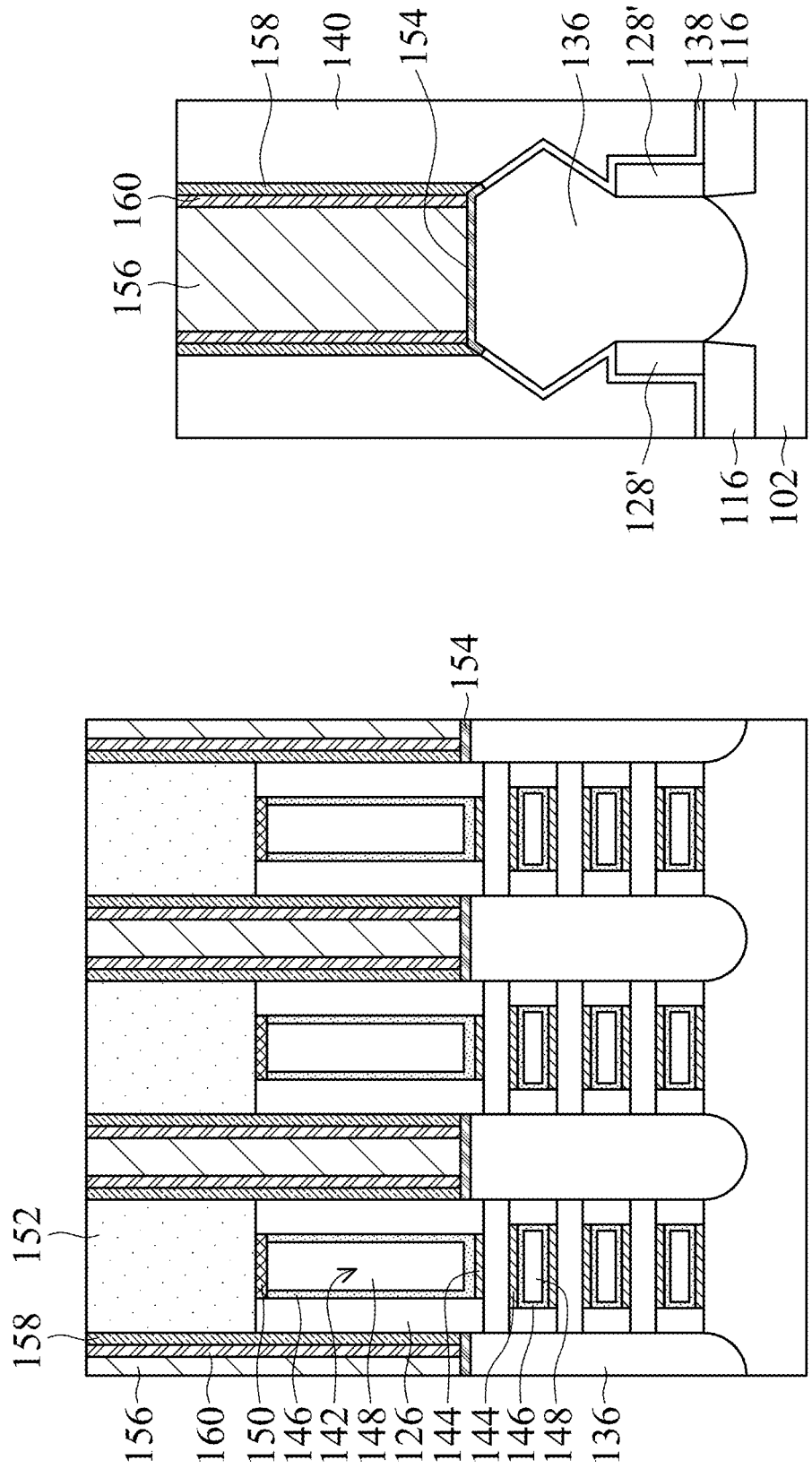
Figures 2, 2I:
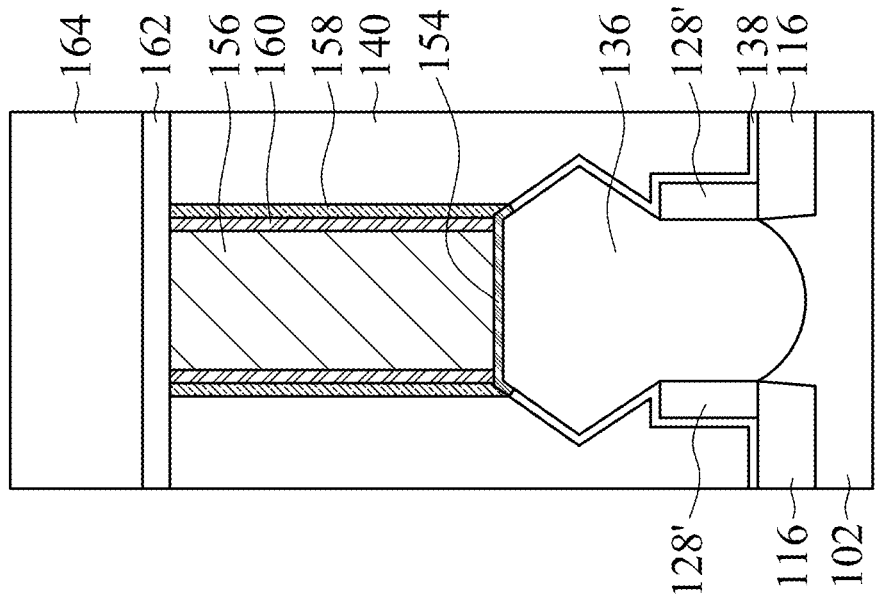
Figures 1, 2I:
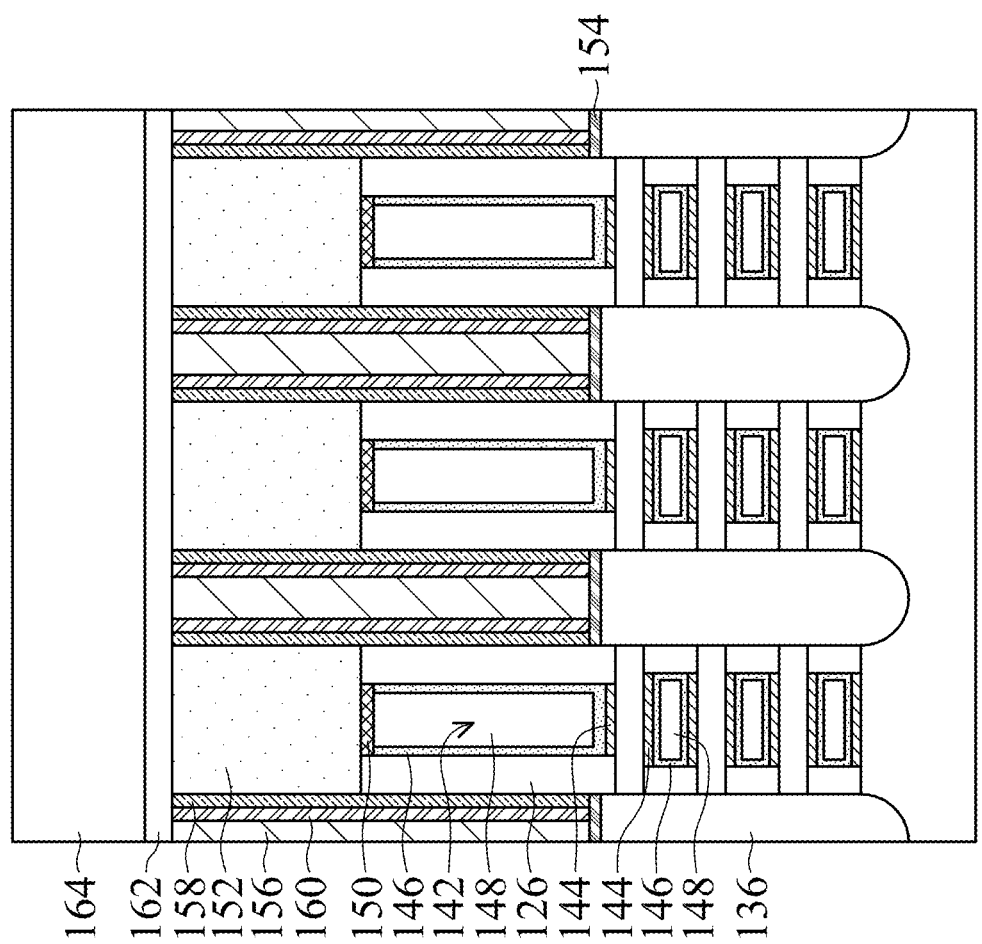
Figures 1, 2, 2K:
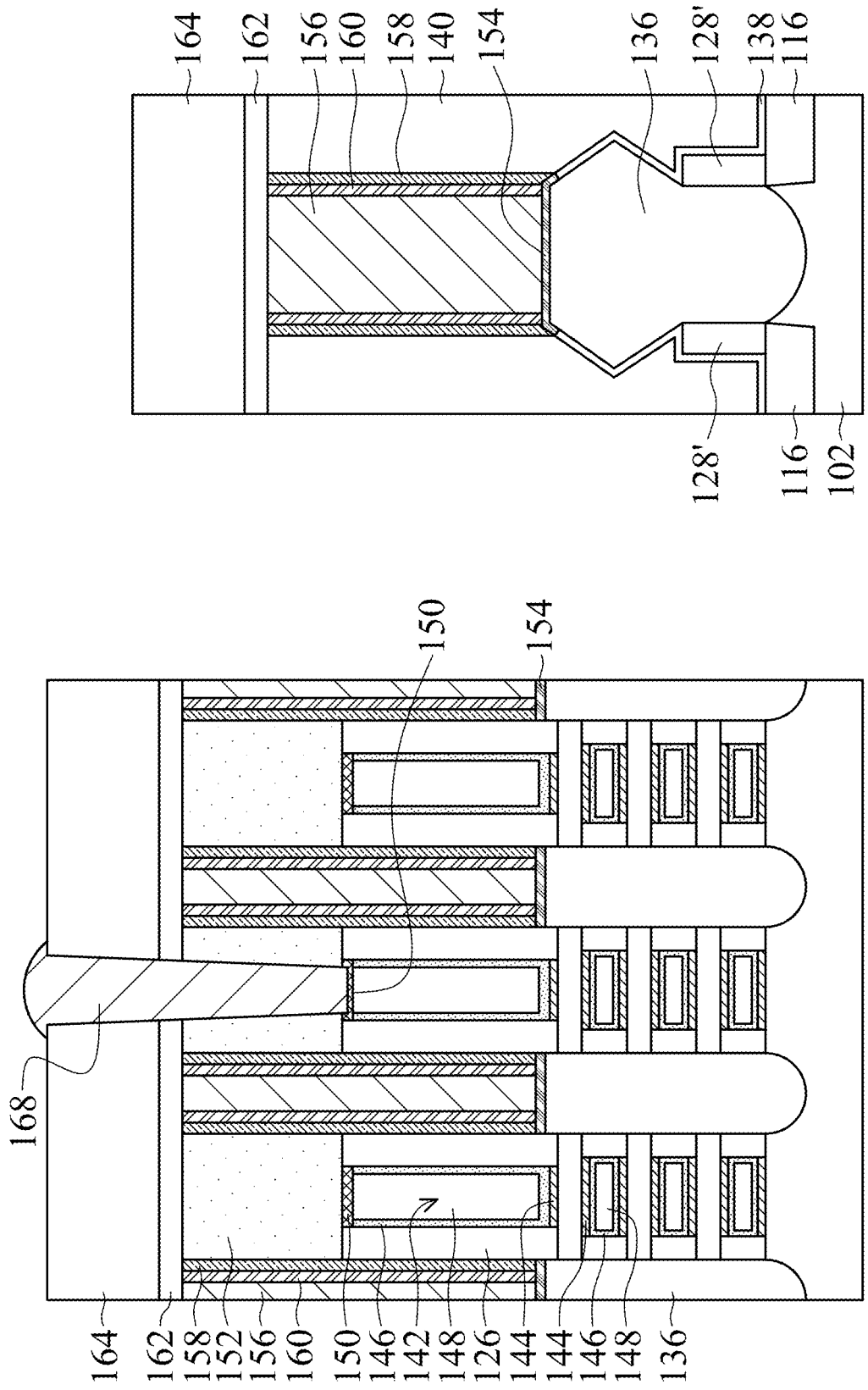
Figures 2, 2L:
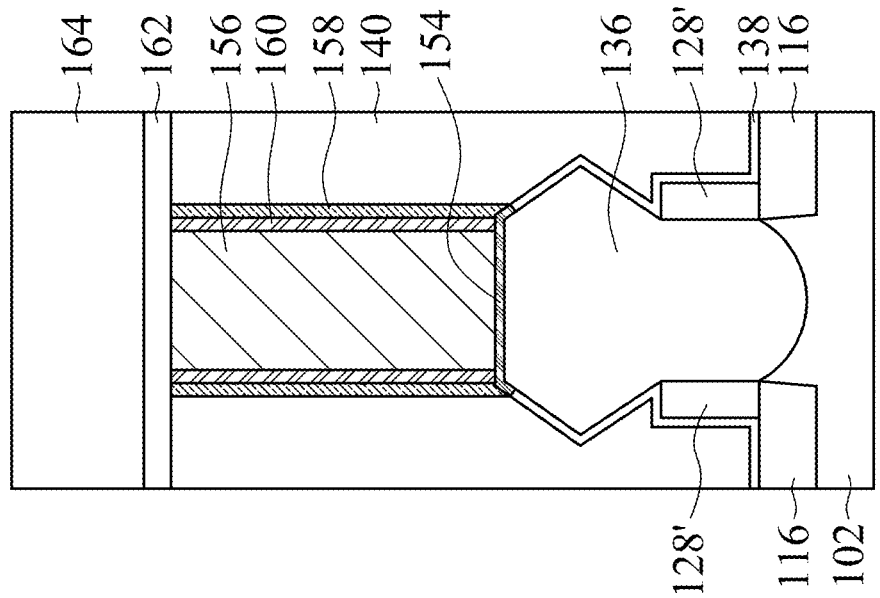
Figures 1, 2L:
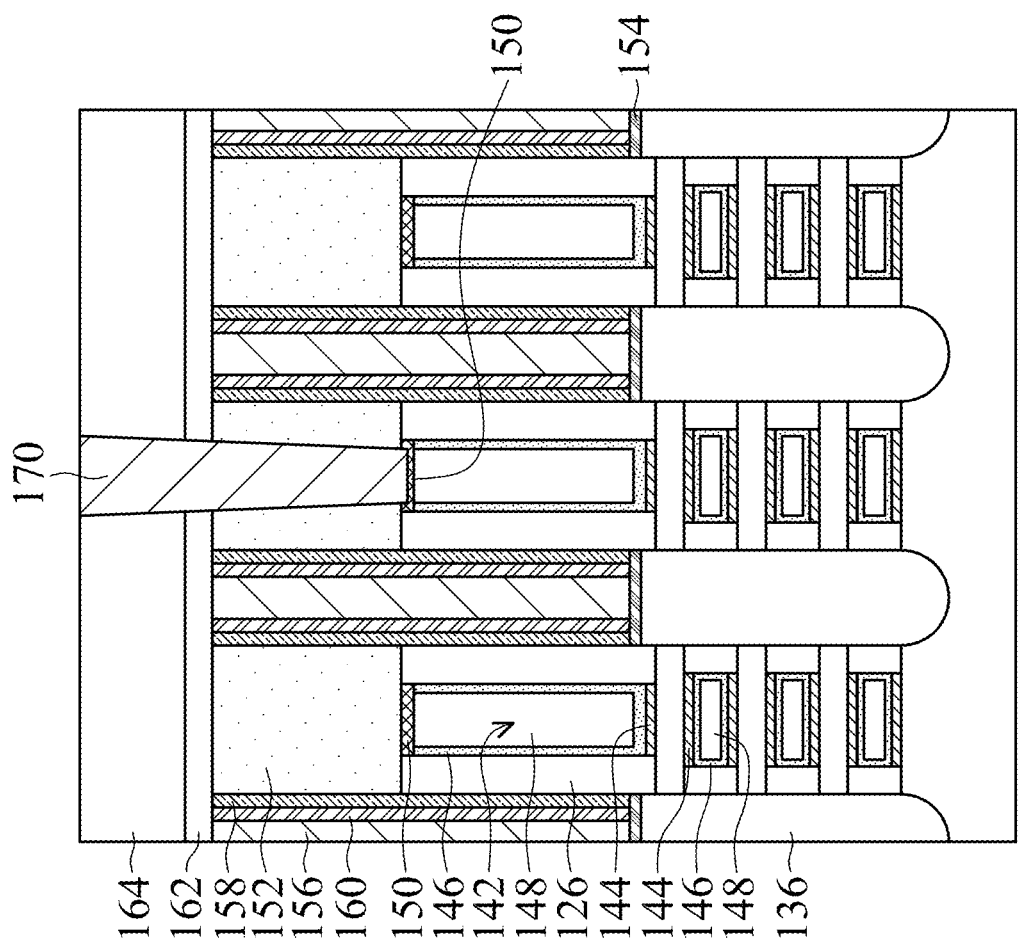
Figures 1, 2, 20:
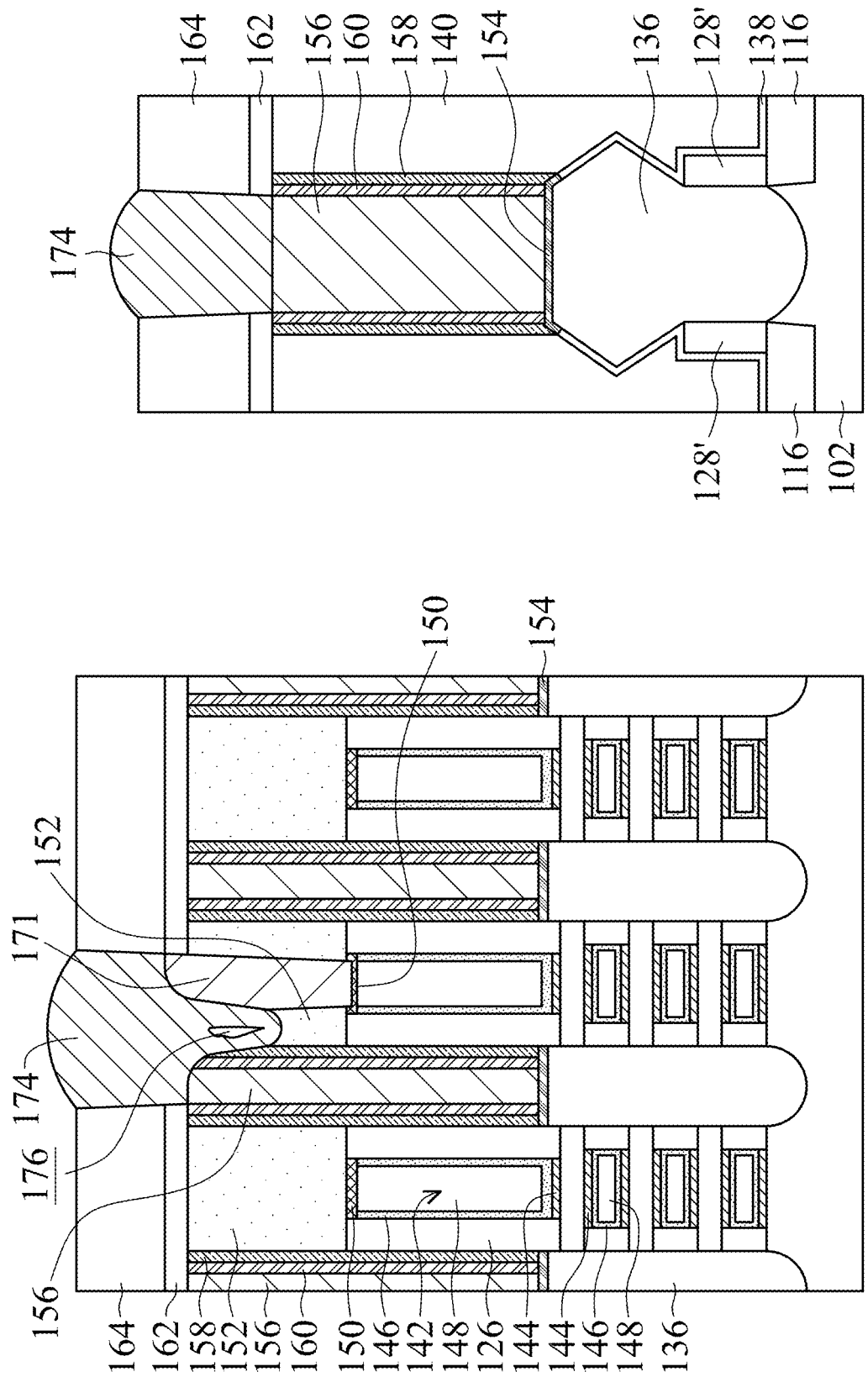
Figures 1, 2, 2P:
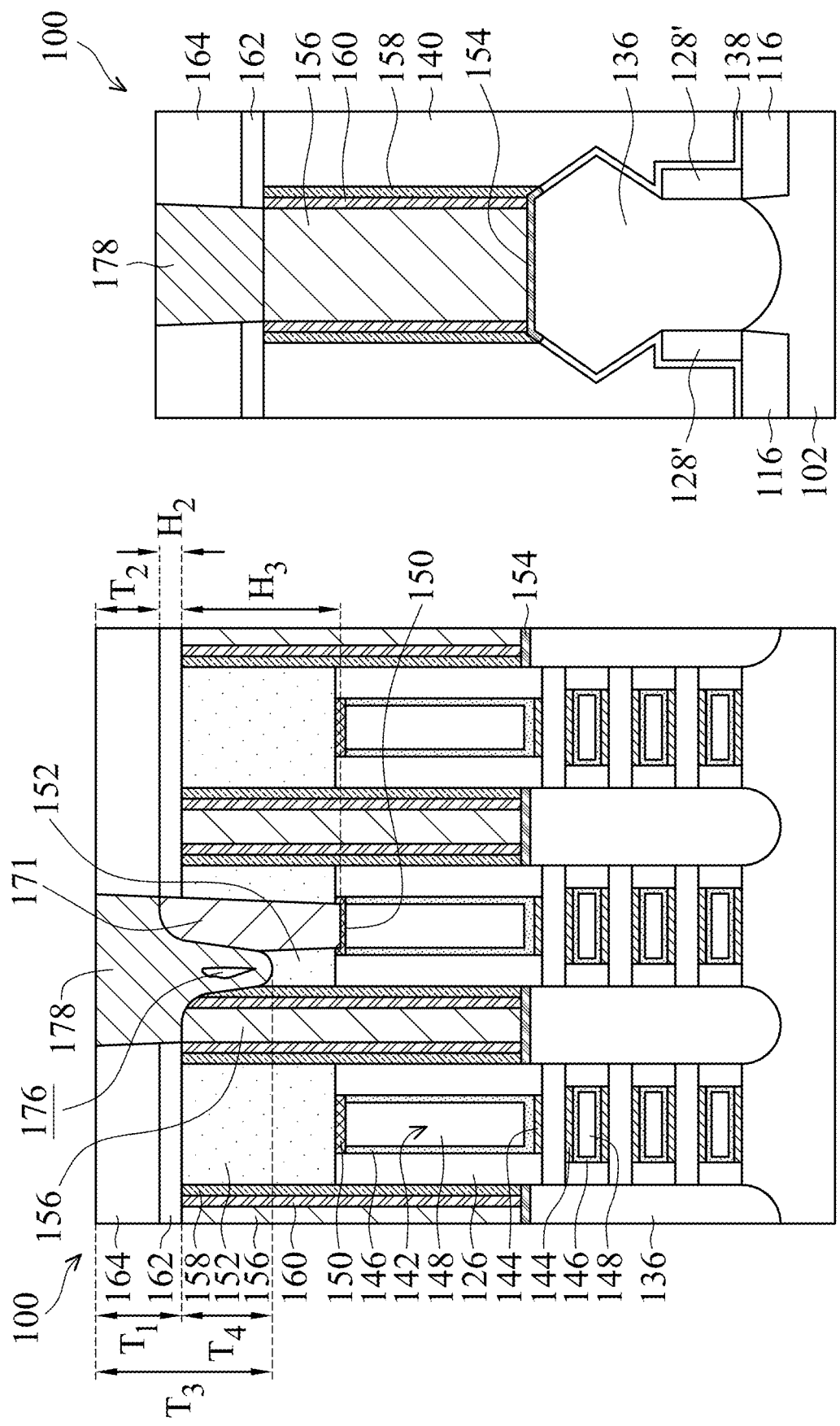

FIGS. 2A-1 to 2P-1 illustrate cross-sectional representations of various stages of manufacturing the semiconductor structure 100 shown along line A-A' in FIG. 1E in accordance with some embodiments. FIGS. 2A-2 to 2P-2 illustrate cross-sectional representations of various stages of manufacturing the semiconductor structure 100 shown along line B-B' in FIG. 1E in accordance with some embodiments. More specifically, FIG. 2A-1 illustrates the cross-sectional representation shown along line A-A' and FIG. 2A-2 illustrates the cross-sectional representation shown along line B-B' in FIG. 1E in accordance with some embodiments.

After the gate spacers 126 and the fin spacers 128 are formed, the source/drain regions of the fin structure 104 are recessed to form source/drain recesses 130, as shown in FIGS. 2B-1 and 2B-2 in accordance with some embodiments. More specifically, the first semiconductor material layers 106 and the second semiconductor material layers 108 not covered by the dummy gate structures 118 and the gate spacers 126 are removed in accordance with some embodiments. In addition, some portions of the base fin structure 104B are also recessed to form curved top surfaces, as shown in FIG. 2B-1 in accordance with some embodiments.

In some embodiments, the fin structure 104 is recessed by performing an etching process. The etching process may be an anisotropic etching process, such as dry plasma etching, and the dummy gate structure 118 and the gate spacers 126 are used as etching masks during the etching process. In some embodiments, the fin spacers 128 are also recessed to form lowered fin spacers 128'.

After the source/drain recesses 130 are formed, the first semiconductor material layers 106 exposed by the source/drain recesses 130 are laterally recessed to form notches 132, as shown in FIGS. 2C-1 and 2C-2 in accordance with some embodiments.

In some embodiments, an etching process is performed on the semiconductor structure 100 to laterally recess the first semiconductor material layers 106 of the fin structure 104 from the source/drain recesses 130. In some embodiments, during the etching process, the first semiconductor material layers 106 have a greater etching rate (or etching amount) than the second semiconductor material layers 108, thereby forming notches 132 between adjacent second semiconductor material layers 108. In some embodiments, the etching process is an isotropic etching such as dry chemical etching, remote plasma etching, wet chemical etching, another suitable technique, and/or a combination thereof.

Next, inner spacers 134 are formed in the notches 132 between the second semiconductor material layers 108, as shown in FIGS. 2D-1 and 2D-2 in accordance with some embodiments. The inner spacers 134 are configured to separate the source/drain structures and the gate structures formed in subsequent manufacturing processes in accordance with some embodiments. In some embodiments, the inner spacers 134 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof.

After the inner spacers 134 are formed, source/drain structures 136 are formed in the source/drain recesses 130, as shown in FIGS. 2E-1 and 2E-2 in accordance with some embodiments. In some embodiments, the source/drain structures 136 are formed using an epitaxial growth process, such as MBE, MOCVD, VPE, other applicable epitaxial growth process, or a combination thereof. In some embodiments, the source/drain structures 136 are made of any applicable material, such as Ge, Si, GaAs, AlGaAs, SiGe, GaAsP, SiP, SiC, SiCP, or a combination thereof.

In some embodiments, the source/drain structures 136 are in-situ doped during the epitaxial growth process. For example, the source/drain structures 136 may be the epitaxially grown SiGe doped with boron (B). For example, the source/drain structures 136 may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features. In some embodiments, the source/drain structures 136 are doped in one or more implantation processes after the epitaxial growth process.

After the source/drain structures 136 are formed, a contact etch stop layer (CESL) 138 is conformally formed to cover the source/drain structures 136 and an interlayer dielectric (ILD) layer 140 is formed over the contact etch stop layers 138, as shown in FIGS. 2F-1 and 2F-2 in accordance with some embodiments.

In some embodiments, the contact etch stop layer 138 is made of a dielectric materials, such as silicon nitride, silicon oxide, silicon oxynitride, another suitable dielectric material, or a combination thereof. The dielectric material for the contact etch stop layers 138 may be conformally deposited over the semiconductor structure by performing CVD, ALD, other application methods, or a combination thereof.

The interlayer dielectric layer 140 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The interlayer dielectric layer 140 may be formed by chemical vapor deposition (CVD), physical vapor deposition, (PVD), atomic layer deposition (ALD), or other applicable processes.

After the contact etch stop layer 138 and the interlayer dielectric layer 140 are deposited, a planarization process such as CMP or an etch-back process may be performed until the gate electrode layers 120 of the dummy gate structures 118 are exposed, as shown in FIG. 2F-1 in accordance with some embodiments.

Next, the dummy gate structures 118 are replaced by gate structure 142, as shown in FIGS. 2G-1 and 2G-2 in accordance with some embodiments. More specifically, the dummy gate structures 118 and the first semiconductor material layers 106 are removed to form nanostructures 108' with the second semiconductor material layers 108 in accordance with some embodiments. The removal process may include one or more etching processes. For example, when the dummy gate electrode layers 122 are polysilicon, a wet etchant such as a tetramethylammonium hydroxide (TMAH) solution may be used to selectively remove the dummy gate electrode layers 122. Afterwards, the dummy gate dielectric layers 120 may be removed using a plasma dry etching, a dry chemical etching, and/or a wet etching. The first semiconductor material layers 106 may be removed by performing a selective wet etching process, such as APM (e.g., ammonia hydroxide-hydrogen peroxide-water mixture) etching process. For example, the wet etching process uses etchants such as ammonium hydroxide (NH$_4$OH), TMAH, ethylenediamine pyrocatechol (EDP), and/or potassium hydroxide (KOH) solutions. In some embodiments, the upper portions of the gate spacers 126 are also removed.

After the nanostructures 108' are formed, gate structures 142 are formed wrapping around the nanostructures 108', as shown in FIGS. 2G-1 and 2G-2 in accordance with some embodiments. The gate structures 142 wrap around the nanostructures 108' to form gate-all-around transistor structures in accordance with some embodiments. In some embodiments, the gate structure 142 includes an interfacial layer 144, a gate dielectric layer 146, and a gate electrode layer 148.

In some embodiments, the interfacial layers 144 are oxide layers formed around the nanostructures 108' and on the top of the base fin structure 104B. In some embodiments, the interfacial layers 144 are formed by performing a thermal process.

In some embodiments, the gate dielectric layers 146 are formed over the interfacial layers 144, so that the nanostructures 108' are surrounded (e.g. wrapped) by the gate dielectric layers 146. In addition, the gate dielectric layers 146 also cover the sidewalls of the gate spacers 126 and the inner spacers 134 in accordance with some embodiments. In some embodiments, the gate dielectric layers 146 are made of one or more layers of dielectric materials, such as HfO$_2$, HfSiO, HfSiON, HfTaO, HfTiO, HfZrO, zirconium oxide, aluminum oxide, titanium oxide, hafnium dioxide-alumina (HfO$_2$—Al$_2$O$_3$) alloy, another suitable high-k dielectric material, or a combination thereof. In some embodiments, the gate dielectric layers 146 are formed using CVD, ALD, another applicable method, or a combination thereof.

In some embodiments, the gate electrode layers 148 are formed on the gate dielectric layer 146. In some embodiments, the gate electrode layers 148 are made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the gate electrode layers 148 are formed using CVD, ALD, electroplating, another applicable method, or a combination thereof. Other conductive layers, such as work function metal layers, may also be formed in the gate structures 142, although they are not shown in the figures. After the interfacial layers 144, the gate dielectric layers 146, and the gate electrode layers 148 are formed, a planarization process such as CMP or an etch-back process may be performed until the interlayer dielectric layer 140 is exposed.

Afterwards, an etch back process is performed to remove the upper portion of the gate structures 142, and cap layers 150 and mask layers 152 are formed over the gate structures 142, as shown in FIGS. 2G-1 and 2G-2 in accordance with some embodiments. More specifically, the upper portion of the gate structures 142 are removed to form a recess in the interlayer dielectric layer 140 and the cap layers 150 and the mask layers 152 are formed in the recess in accordance with some embodiments.

In some embodiments, the cap layers 150 are made of W, Ti, Co, Ru, Ni, or the like. The cap layers 150 may be formed using CVD, ALD, electroplating, another applicable method, or a combination thereof. In some embodiments, the cap layers 150 are selectively formed over the gate structures 142. In some embodiments, the mask layers 152 are made of SiO$_2$, Si$_3$N$_4$, SiON, SiOCN, SiOCH, or the like. The mask layers 152 may be formed using CVD, ALD, electroplating, another applicable method, or a combination thereof.

After the mask layers 152 are formed, contact openings are formed through the contact etch stop layer 138 and the interlayer dielectric layer 140, and silicide layers 154 and contacts 156 are formed over the source/drain structures 136, as shown in FIGS. 2H-1 and 2H-2 in accordance with some embodiments. In some embodiments, liners 158 and barrier layers 160 are formed around the contacts 156.

More specifically, the contact openings may be formed through the contact etch stop layer 138 and the interlayer dielectric layer 140 to expose the top surfaces of the source/drain structures 136, and the silicide layers 154 and the contacts 156 may be formed in the contact openings. The contact openings may be formed using a photolithography process and an etching process. In addition, some portions of the source/drain structures 136 exposed by the contact openings may also be etched during the etching process.

After the contact openings are formed, the silicide layers 154 may be formed by forming a metal layer over the top surface of the source/drain structures 136 and annealing the metal layer so the metal layer reacts with the source/drain structures 136 to form the silicide layers 160. The unreacted metal layer may be removed after the silicide layers 154 are formed.

Afterwards, the liners 158, the barrier layers 160, and the contacts 156 are formed over the silicide layers 154 in the contact openings and a polishing process is performed, as shown in FIGS. 2H-1 and 2H-2 in accordance with some embodiments. As shown in FIG. 2H-1, the top surface of the contact 156 is substantially level with the top surface of the mask layer 152 in accordance with some embodiments.

In some embodiments, the contacts 156 are made of a conductive material including aluminum (Al), copper (Cu), tungsten (W), titanium (Ti), tantalum (Ta), titanium nitride (TiN), cobalt, tantalum nitride (TaN), nickel silicide (NiS), cobalt silicide (CoSi), copper silicide, tantalum carbide (TaC), tantalum silicide nitride (TaSiN), tantalum carbide nitride (TaCN), titanium aluminide (TiAl), titanium aluminum nitride (TiAlN), other applicable conductive materials, or a combination thereof. In some embodiments, the liner 158 is made of silicon nitride, although any other applicable dielectric may be used as an alternative. In some embodiments, the barrier layer 160 is made of tantalum nitride, although other materials, such as tantalum, titanium, titanium nitride, or the like, may also be used. The liners 158, the barrier layers 160, and the contacts 156 may be formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes.

In some embodiments, the top surface of the contact 156 is higher than the top surface of the gate structure 142 and is substantially level with the mask layer 152. In some embodiments, the height difference between the contact 156 and the gate structure 142 is substantially level with the height of the mask layer 152.

After the contacts 156 are formed, an etch stop layer 162 is formed over the contacts 156 and the mask layers 152, and a dielectric layer 164 is formed over the etch stop layer 162, as shown in FIGS. 2I-1 and 2I-2 in accordance with some embodiments.

In some embodiments, the etch stop layer 162 is made of a dielectric materials, such as silicon nitride, silicon oxide, silicon oxynitride, another suitable dielectric material, or a combination thereof. The dielectric material for the contact etch stop layers 162 may be conformally deposited over the semiconductor structure by performing CVD, ALD, other application methods, or a combination thereof.

The dielectric layer 164 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The dielectric layer 164 may be formed by chemical vapor deposition (CVD), physical vapor deposition, (PVD), atomic layer deposition (ALD), or other applicable processes.

After the dielectric layer 164 is formed, a first trench 166 is formed through the mask layer 152, the etch stop layer 162, and the dielectric layer 164, as shown in FIGS. 2J-1 and 2J-2 in accordance with some embodiments. In some embodiments, the upper portion of the cap layer 150 is also etched when forming the first trench 166. The first trench 166 may be formed by performing one or more etching processes, including dry etching processes and/or wet etching processes.

Next, a conductive material 168 is formed in the first trench 166, as shown in FIGS. 2K-1 and 2K-2 in accordance with some embodiments. In some embodiments, the conductive material 168 is W, Ru, Mo, or the like. In some embodiments, the conductive material 168 is formed by performing chemical vapor deposition (CVD), physical vapor deposition, (PVD), atomic layer deposition (ALD), or other applicable processes.

In some embodiments, the conductive material 168 is formed by performing a bottom-up deposition process. The bottom-up deposition process generally refers to a deposition process that fills an opening from bottom to top. By using the bottom-up deposition process, the first trench 166 may be filled with no air gap generated therein. In some embodiments, the bottom-up deposition process is a selective CVD process that the conductive material 168 is selectively deposited over the cap layer 150.

In some embodiments, the conductive material 168 is Ru, and a precursor gas used in the bottom-up deposition process includes $Ru(CO)_5$, $Ru_3(CO)_{12}$, $RuCl_3$, $Ru(od)_3$, Bis(cyclopentadienyl)ruthenium(II), $Ru(CO)_3C_6H_8$, $Ru(CO)_2$(tmhd)$_2$, $Ru(EtCp)_2$, $Ru(CO)_2(acac)_2$, $Ru(C_6H_6)(C_6H_8)$, $Ru(DMBD)(CO)_3$, a combination thereof, or the like. In some embodiments, the conductive material 168 is W, and a precursor gas used in the bottom-up deposition process includes $W(CO)_6$, $W(F)_6$, or the like. In some embodiments, the conductive material 168 is Mo, and a precursor gas used in the bottom-up deposition process includes $MoF_6$, $Mo(CO)_6$, $MoCl_5$, $MoO_xCl_y$, or the like.

Afterward, a polishing process is performed to form a conductive structure 170 in the first trench 166 over the gate structure 142, as shown in FIGS. 2L-1 and 2L-2 in accordance with some embodiments. In some embodiments, a CMP process is performed to polish the conductive material 168 so that the top surface of the conductive structure 170 is substantially level with the top surface of the dielectric layer 164.

Next, the conductive structure 170 is shortened to form a shortened conductive structure 171, as shown in FIGS. 2M-1 and 2M-2 in accordance with some embodiments. More specifically, the upper portion of the conductive structure 170 is etched back, so that the top surface of the shorted conductive structure 171 is substantially level with the top surface of the etch stop layer 162 in accordance with some embodiments.

In some embodiments, the height $H_1$ of the shortened conductive structure 171 is in a range from about 10 nm to about 50 nm. In some embodiments, the depth $D_1$ of the trench 167 (e.g. the height of the removing upper portion of the conductive structure 170) is in a range from about 30 nm to about 70 nm. In some embodiments, the ratio of the height $H_1$ to the depth $D_1$ is in a range from about 0.6 to about 7.

After the conductive structure 170 is shortened, a second trench 172 is formed through the dielectric layer 164 and the etch stop layer 162 to expose both the top surface of the contact 156 and the top surface of the shortened conductive structure 171, as shown in FIGS. 2N-1 and 2N-2 in accordance with some embodiments. The second trench 172 may be formed by performing an etching process. During the etching process, the corner of the contact 156 and the corner of the shortened conductive structure 171 are both etched, such that the contact 156 and the shortened conductive structure 171 have rounded corners facing each other in accordance with some embodiments.

In some embodiments, a portion of the mask layer 152 is also removed, such that the second trench 172 has an extending portion 173 extending into the mask layer 142. In some embodiments, the bottommost portion of the extending portion 173 of the second trench 172 is lower than the top surface of the contact 156. In addition, an upper portion of the sidewall of the shortened conductive structure 171 is exposed by the extending portion 173 of the second trench 172 in accordance with some embodiments.

Next, a conductive material 174 is formed in the second trench 172, as shown in FIGS. 2O-1 and 2O-2 in accordance with some embodiments. Since the corner of the shortened conductive structure 171 is etched, the shortened conductive structure 171 and the conductive material 174 have a curve interface in accordance with some embodiments.

In some embodiments, the conductive material 174 is W, Ru, Mo, Cu, or the like. In some embodiments, the conductive material 174 and the conductive material 168 are the same metal. In some embodiments, the conductive material 174 and the conductive material 168 are different metals.

In some embodiments, the conductive material 174 is formed by performing chemical vapor deposition (CVD), physical vapor deposition, (PVD), atomic layer deposition (ALD), or other applicable processes. In some embodiments, the conductive material 174 is formed by performing a bottom-up deposition process. The bottom-up deposition process used for forming the conductive material 174 may be the same as, or similar to, those for forming the conductive material 168 and are not repeated herein. In some embodiments, the deposition processes (e.g. precursor gas) for the conductive material 174 and the conductive material 168 are the same.

Since the shortened conductive structure 171 is formed first, the height difference of different regions of the second trench 172 (e.g. the region over the contact 156 and the region over the gate structure 142) can be relatively small. Accordingly, the conductive material 174 can be formed by performing a bottom-up deposition process with improved connection between the contact 156 and the gate structure 142.

In some embodiments, a void 176 is formed in the conductive material 174 at the extending portion 173 of the second trench 172. In some embodiments, the void 176 is sandwiched between the contact 156 and the shortened conductive structure 171 and is directly over the mask layer 152.

Afterward, a polishing process is performed to form a conductive structure 178 in the semiconductor structure 100, as shown in FIGS. 2P-1 and 2P-2 in accordance with some embodiments. In some embodiments, a CMP process is performed to polish the conductive material 174, so that the top surface of the conductive structure 178 is substantially level with the top surface of the dielectric layer 164.

In some embodiments, the height difference $H_2$ between the shortened conductive structure 171 and the contact 156 is smaller than 10 nm. Since the height difference $H_2$ between the shortened conductive structure 171 and the contact 156 is relatively small, the conductive structure 178 may be better formed. That is, the risk of disconnection between the gate structure 142 and the contact 156 due to the height difference between the gate structure 142 and the contact 156 can be reduced. In some embodiments, the ratio of the height difference $H_2$ between the shortened conductive structure 171 and the contact 156 to the height difference $H_3$ of the contact 156 and the gate structure 142 is in a range from about 0.2 to about 0.5.

As shown in FIG. 2P-1, the conductive structure 178 may have different thicknesses at different portions. In some embodiments, the conductive structure 178 has a first portion over the contact 156, and the thickness $T_1$ of the first portion is in a range from about 35 nm to about 90 nm. In some embodiments, the conductive structure 178 has a second portion over the shortened conductive structure 171, and the thickness $T_2$ of the second portion is in a range from about 30 nm to about 70 nm. In some embodiments, the ratio of the thickness $T_2$ to the thickness $T_1$ is in a range from about 0.5 to about 3.

In some embodiments, the conductive structure 178 has a third portion between the first portion and the second portion, and the thickness $T_3$ of the third portion is in a range from about 38 nm to about 100 nm. More specifically, the conductive structure 178 has an extending portion interposing between the shortened conductive structure 171 and the contact 156, and the thickness $T_4$ of the extending portion is in a range from about 3 nm to about 10 nm.

In some embodiments, the bottommost portion of the conductive structure 178 (e.g. the bottommost portion of the extending portion of the conductive structure 178) is lower than the topmost portions (e.g. top surfaces) of the shortened conductive structure 171, the contact 156, the mask layer 152, and the etch stop layer 162. In addition, the bottommost portion of the conductive structure 178 is higher than the bottommost surfaces of the shortened conductive structure 171, the contact 156, and the mask layer 152.

It is appreciated that although the cross-sectional views shown in FIGS. 2P-1 and 2P-2 are described with reference to a method, the structures are not limited to the method but rather may stand alone separate of the method.

Figures 3, 4:
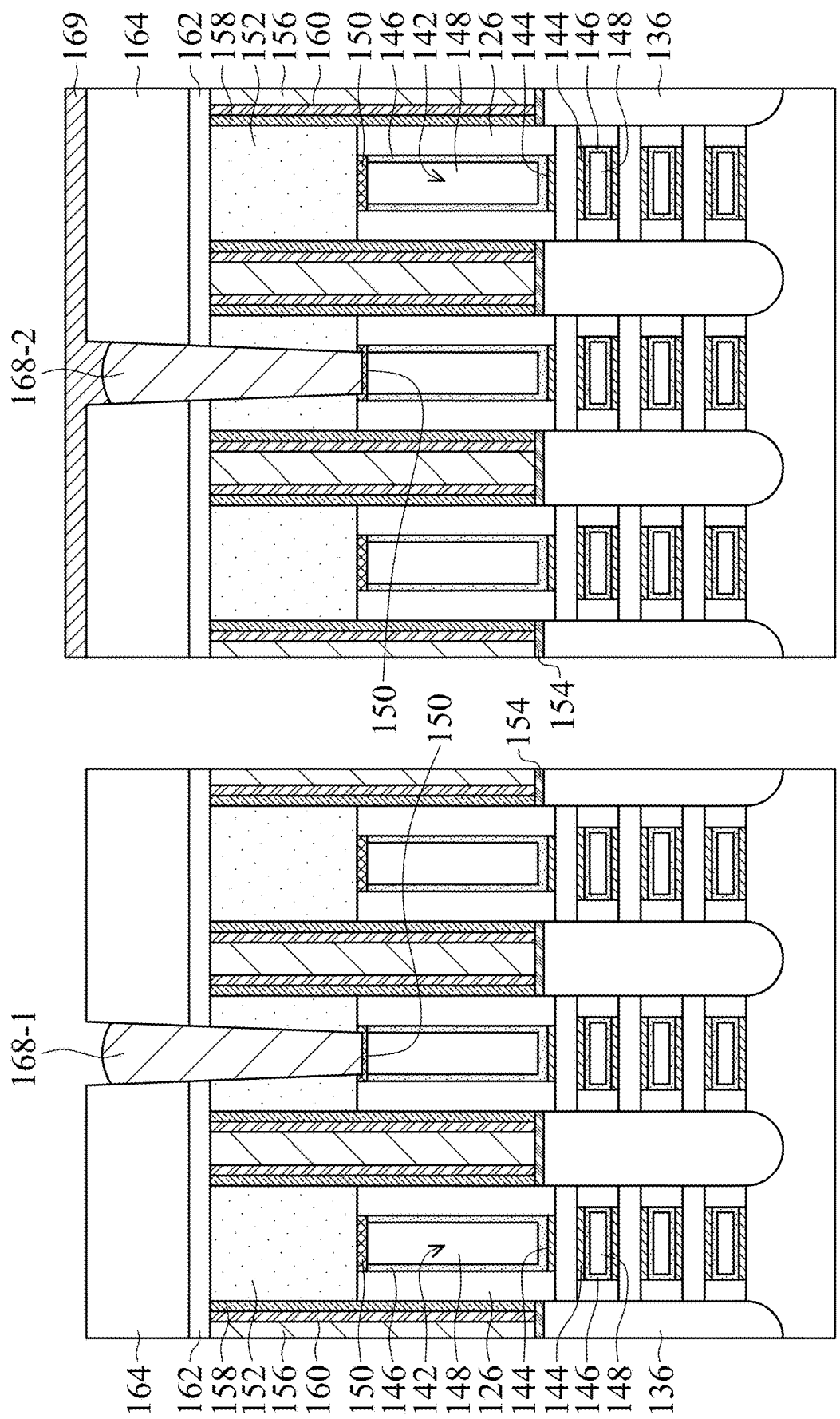
FIG. 3 illustrates a cross-sectional view of another intermediate stage of manufacturing the semiconductor structure in accordance with some embodiments.
FIG. 4 illustrates a cross-sectional view of another intermediate stage of manufacturing the semiconductor structure in accordance with some embodiments.

FIG. 3 illustrates a cross-sectional view of another intermediate stage of manufacturing the semiconductor structure 100 in accordance with some embodiments. The processes for manufacturing the semiconductor structure 100 described above may be performed, except a conductive material 168-1 formed in the first trench may be thinner than the conductive material 168 shown in FIG. 2K-1 in accordance with some embodiments.

More specifically, the processes shown in FIGS. 1A to 1E, 2A-1 to 2J-1, and 1A-2 to 2J-2 are performed to form a first trench (e.g. the first trench 166) through the mask layer 152, the etch stop layer 162, and the dielectric layer 164 in accordance with some embodiments. Afterwards, a conductive material 168-1 is formed in the first trench, as shown in FIG. 3 in accordance with some embodiments. The conductive material 168-1 may be similar to the conductive material 168, except the conductive material 168-1 does not cover the top surface of the dielectric layer 164. The processes and materials for forming the conductive material 168-1 may be similar to, or the same as, those for forming the conductive material 168 and are not repeated herein.

In some embodiments, the top surface of the conductive material 168-1 is lower than the top surface of the dielectric layer 164, such that the first trench is not fully filled with the conductive material 168-1. After the conductive material 168-1 is formed, a polishing process is performed to form the conductive structure over the gate structure 142 in accordance with some embodiments. During the polishing process, the upper portion of the conductive material 168-1 and the upper portion of the dielectric layer 164 are removed, so that the resulting conductive structure and the dielectric layer 164 can still have substantially flat top surfaces (similar to that shown in FIGS. 2L-1 and 2L-2) in accordance with some embodiments. Afterwards, the processes shown in FIGS. 2M-1 to 2P-1 and 2M-2 to 2P-2 may be performed to form the semiconductor structure 100.

FIG. 4 illustrates a cross-sectional view of another intermediate stage of manufacturing the semiconductor structure 100 in accordance with some embodiments. The processes for manufacturing the semiconductor structure 100 described above may be performed, except a conductive material 168-2 and an addition conductive material 169 are formed in accordance with some embodiments.

More specifically, the processes shown in FIGS. 1A to 1E, 2A-1 to 2J-1, and 1A-2 to 2J-2 are performed to form a first trench (e.g. the first trench 166) through the mask layer 152, the etch stop layer 162, and the dielectric layer 164 in accordance with some embodiments. Afterwards, the conductive material 168-2 is formed in the first trench, and the conductive material 169 is formed over the conductive material 168-2, as shown in FIG. 4 in accordance with some embodiments. The processes and materials for forming the conductive material 168-2 may be similar to, or the same as, those for forming the conductive material 168 and are not repeated herein.

Similar to the conductive material 168-1, the top surface of the conductive material 168-2 is lower than the top surface of the dielectric layer 164, such that the first trench is not fully filled with the conductive material 168-2 in accordance with some embodiments. In addition, the upper portion of the first trench is filled with the conductive material 169 and the top surface of the dielectric layer 164 is covered by the conductive material 169 in accordance with some embodiments.

In some embodiments, the conductive material 168-2 and the conductive material 169 are made of the same material but are formed by different processes. In some embodiments, the conductive material 169 is formed by performing a CVD process.

After the conductive material 169 is formed, a polishing process is performed to form the conductive structure over the gate structure 142 in accordance with some embodiments. In some embodiments, the conductive material 169 are completely removed during the polishing process, so that the resulting conductive structure is completely made of the conductive material 168-2. In some embodiments, the upper portion of the conductive material 168-2 and the upper portion of the dielectric layer 164 are also removed during the polishing process. Since the upper portion of the first trench is filled with the conductive material 169 and the top surface of the dielectric layer 164 is covered by the conductive material 169, the uniformity of the polishing process may be improved. Afterwards, the processes shown in FIGS. 2M-1 to 2P-1 and 2M-2 to 2P-2 may be performed to form the semiconductor structure 100.

Figure 5:
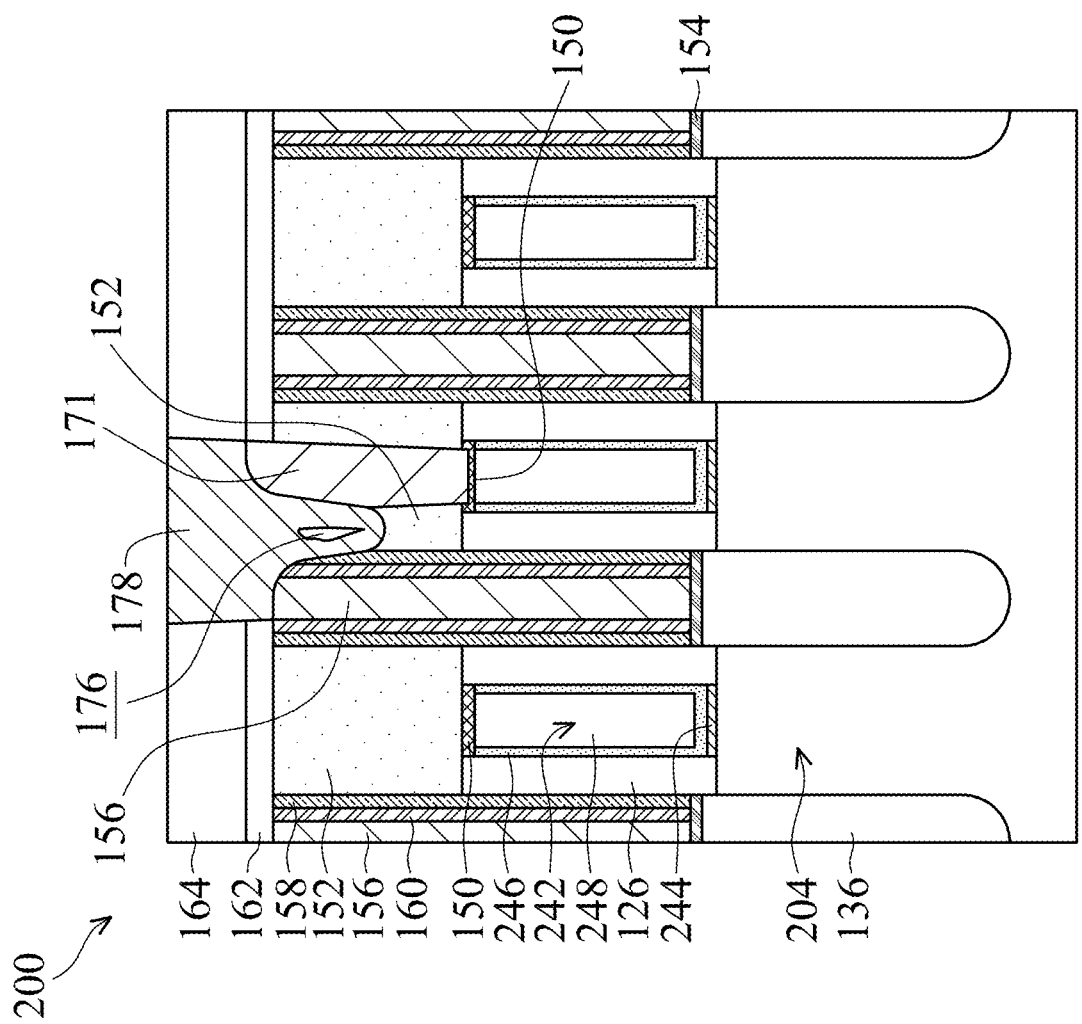
FIG. 5 illustrates a cross-sectional view of a semiconductor structure in accordance with some embodiments.

FIG. 5 illustrates a cross-sectional view of a semiconductor structure 200 in accordance with some embodiments. The semiconductor structure 200 may be similar to the semiconductor structure 100 shown in FIGS. 2P-1 and 2P-2, except the semiconductor structure 200 is a FinFET structure in accordance with some embodiments. Materials and processes for manufacturing the semiconductor structure 200 may be similar to, or the same as, those for manufacturing the semiconductor structure 100 described above and are not repeated herein.

More specifically, a fin structure 204 is formed protruding from the substrate 102 and a gate structure 242 is formed across the fin structure 204, as shown in FIG. 5 in accordance with some embodiments. The gate structure 242 includes an interfacial layer 244, a gate dielectric layer 246, and a gate electrode layer 248 in accordance with some embodiments. The processes and materials for forming the interfacial layer 244, the gate dielectric layer 246, and the gate electrode layer 248 are the same as those for forming the interfacial layer 144, the gate dielectric layer 146, and the gate electrode layer 148 and are not repeated herein. Similar to those shown in FIGS. 2P-1 and 2P-2, the shortened conductive structure 171 is formed over the gate structure 242 and the conductive structure 178 covers both the contact 156 and the shortened conductive structure 171 over the gate structure 242, as shown in FIG. 5 in accordance with some embodiments.

FIGS. 6A-1, 6A-2, 6B-1, and 6B-2 illustrate cross-sectional views of manufacturing a semiconductor structure 100a in accordance with some embodiments. The semiconductor structure 100a may be the same as the semiconductor structure 100, except the shapes of the contact and the shortened conductive structure are different in accordance with some embodiments. Materials and processes for manufacturing the semiconductor structure 100a may be similar to, or the same as, those for manufacturing the semiconductor structure 100 described above and are not repeated herein.

Figures 1, 2, 6A:
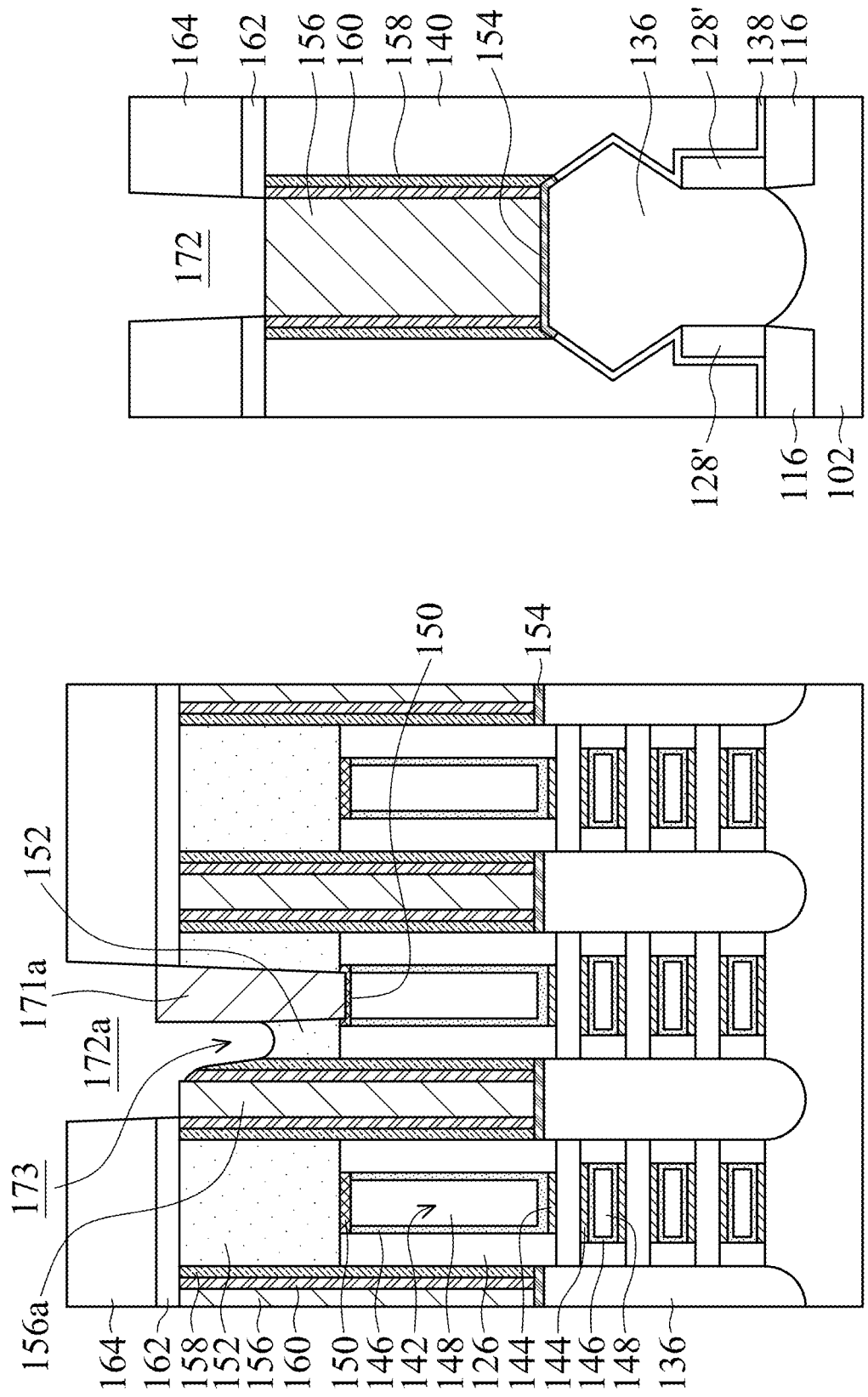
Figures 2, 6B:
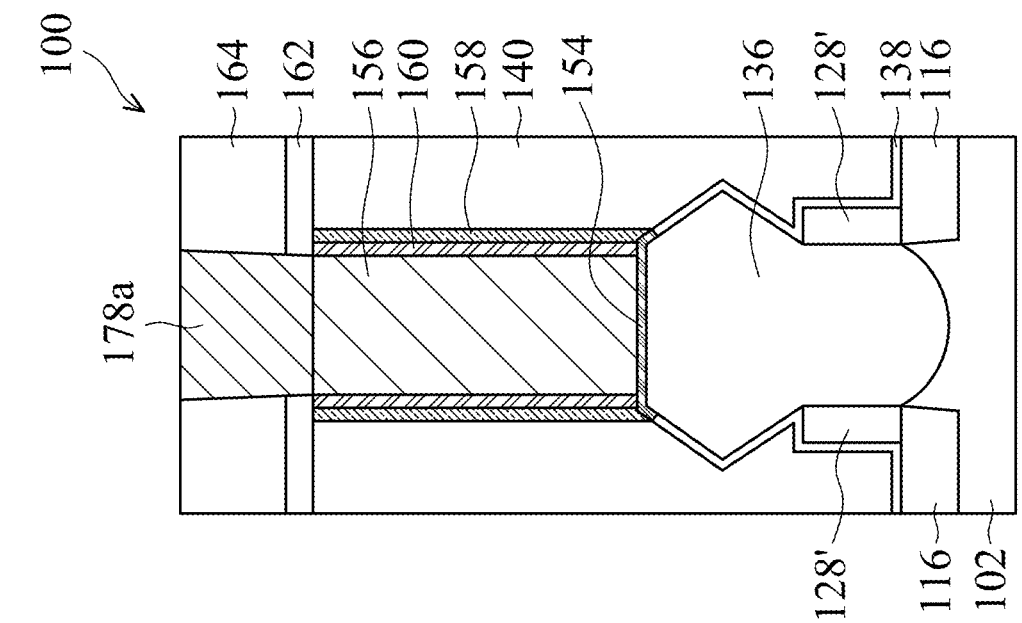
Figures 1, 6B:
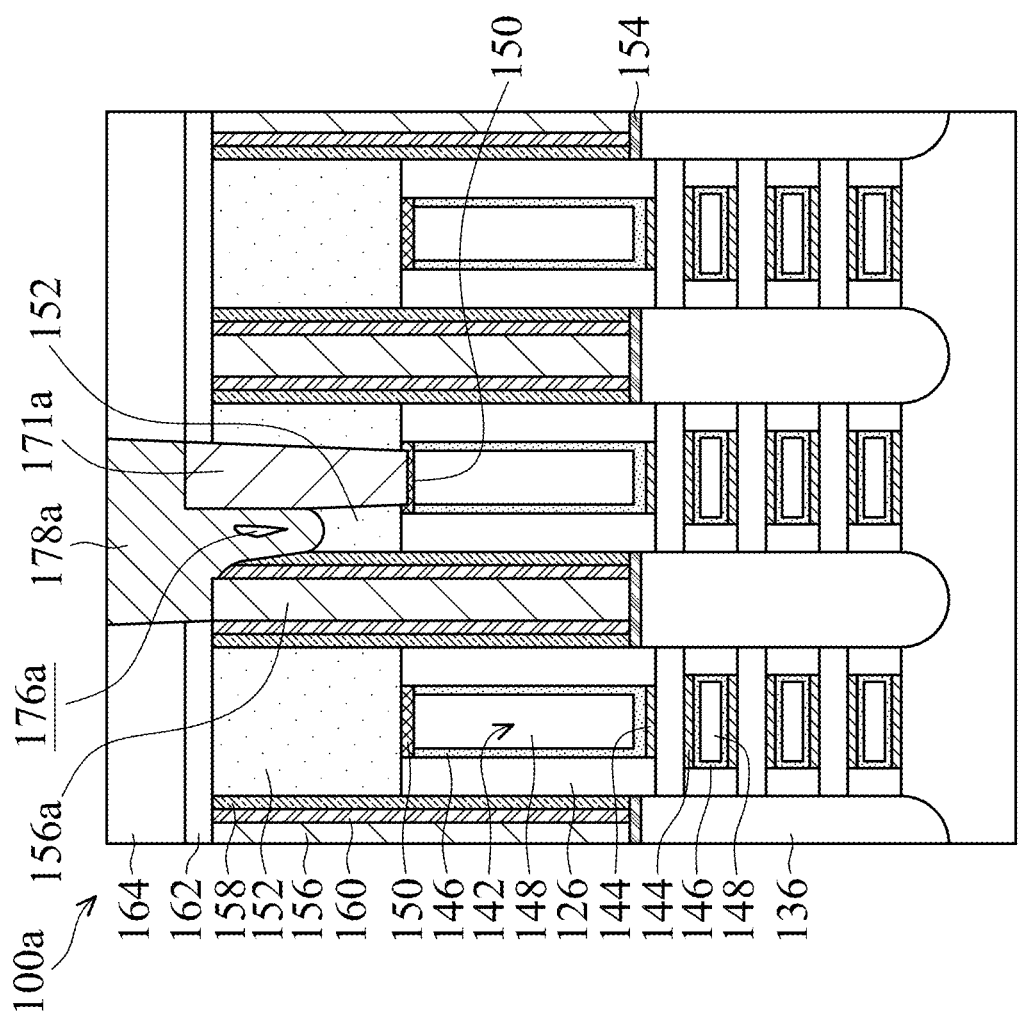

More specifically, FIGS. 6A-1 and 6B-1 are cross-sectional views shown alone the fin direction and FIGS. 6A-2 and 6B-2 are cross-sectional views shown alone the gate direction. Similar to those for forming the semiconductor structure 100, the processes shown in FIGS. 1A to 1E, 2A-1 to 2M-1, and 1A-2 to 2M-2 are performed to form a shortened conductive structure 171a in accordance with some embodiments. Afterwards, the etching process is performed to form a second trench 172a through the dielectric layer 164 and the etch stop layer 162, as shown in FIGS. 6A-1 and 6B-1 in accordance with some embodiments. During the etching process, the etchant may be chosen to have a good etching selectivity between the conductive materials and the dielectric materials, so that the shapes of the contact 156a and the shortened conductive structure 171a may substantially remain.

Next, the processes shown in FIGS. 2O-1, 2O-2, 2P-1, and 2P-2 and described previously are performed to formed a conductive structure 178a in the semiconductor structure 100a, as shown in FIGS. 6B-1 and 6B-2 in accordance with some embodiments. In addition, a void 176a is formed in the conductive structure 178a and is also sandwiched between the shortened conductive structure 171a and the contact 156a in accordance with some embodiments. The processes and materials for forming the contact 156a, the shortened conductive structure 171a, and the conductive structure 178a may be the same as those for forming the contact 156, the shortened conductive structure 171, and the conductive structure 178 described above and are not repeated herein.

FIG. 7 illustrates a cross-sectional view of a semiconductor structure 100b in accordance with some embodiments. The semiconductor structure 100b may be the same as the semiconductor structure 100 shown in FIGS. 2P-1 and 2P-2, except its cap layer 150b extends over the gate spacers 126 in accordance with some embodiments. Materials and processes for manufacturing the semiconductor structure 100b may be similar to, or the same as, those for manufacturing the semiconductor structures 100 described above and are not repeated herein.

More specifically, the cap layer 150b is sandwiched between the shortened conductive structure 171b and the gate structure 142 and is also sandwiched between the mask layer 152 and the gate spacer 126 in accordance with some embodiments. In some embodiments, the cap layer 150b is in direct contact with the liner 158 around the contacts 156. In some embodiments, the cap layer 150b vertically overlaps the void 176b in the conductive structure 178b.

In some embodiments, the cap layers 150b are made of W, Ti, Co, Ru, Ni, or the like. The cap layers 150b may be formed using CVD, ALD, electroplating, another applicable method, or a combination thereof. The processes and materials for forming the shortened conductive structure 171b and the conductive structure 178b may be the same as those for forming the shortened conductive structure 171 and the conductive structure 178 described above and are not repeated herein.

FIG. 8 illustrates a cross-sectional view of a semiconductor structure 100c in accordance with some embodiments. The semiconductor structure 100c may be the same as the semiconductor structure 100 shown in FIGS. 2P-1 and 2P-2, except a barrier layer 179 is formed around a conductive structure 178c in accordance with some embodiments. Materials and processes for manufacturing the semiconductor structure 100c may be similar to, or the same as, those for manufacturing the semiconductor structures 100 described above and are not repeated herein.

More specifically, after the second trench is formed (e.g. the second trench 172 as shown in FIGS. 2N-1 and 2N-2), the barrier layer 179 is formed lining the second trench and the conductive structure 178c is formed over the barrier layer 179, as shown in FIG. 8 in accordance with some embodiments. In some embodiments, the barrier layer 179 is made of tantalum nitride, although other materials, such as tantalum, titanium, titanium nitride, or the like, may also be used. The barrier layers 179 may be formed by using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes.

In some embodiments, a portion of the barrier layer 179 is sandwiched between the shortened conductive structure 171c and the contact 156. In some embodiments, the barrier layer 179 is in direct contact with the contact 156, the mask layer 152, and the shortened conductive structure 171c. In some embodiments, the bottommost portion of the barrier layer 179 is lower than a topmost portion of the mask layer 152, the topmost portion of the contact 156, and the topmost portion of the shortened conductive structure 171c. The processes and materials for forming the shortened conductive structure 171c and the conductive structure 178c may be the same as those for forming the shortened conductive structure 171 and the conductive structure 178 described above and are not repeated herein.

FIG. 9 illustrates a cross-sectional view of a semiconductor structure 100d in accordance with some embodiments. The semiconductor structure 100d may be the same as the semiconductor structure 100 shown in FIGS. 2P-1 and 2P-2, except no void is formed in a conductive structure 178d in accordance with some embodiments. Materials and processes for manufacturing the semiconductor structure 100d may be similar to, or the same as, those for manufacturing the semiconductor structures 100 described above and are not repeated herein.

More specifically, after the second trench is formed (e.g. the second trench 171 shown in FIGS. 2N-1 and 2N-2), the second trench is completely filled with the conductive structure 178d, as shown in FIG. 9 in accordance with some embodiments. The processes and materials for forming the shortened conductive structure 171d and the conductive structure 178d may be the same as those for forming the shortened conductive structure 171 and the conductive structure 178 described above and are not repeated herein.

FIG. 10 illustrates a cross-sectional view of a semiconductor structure 100e in accordance with some embodiments. The semiconductor structure 100e may be the same as the semiconductor structure 100 shown in FIGS. 2P-1 and 2P-2, except a void 176e is formed between a conductive structure 178e and a mask layer 152 in accordance with some embodiments. Materials and processes for manufacturing the semiconductor structure 100e may be similar to, or the same as, those for manufacturing the semiconductor structures 100 described above and are not repeated herein.

More specifically, after the second trench is formed, the bottom portion of the extending portion (e.g. the extending portion 173 shown in FIG. 2N-1) of the second trench is not filled with the conductive structure 178e, such that the void 176e is formed, as shown in FIG. 10 in accordance with some embodiments. In some embodiments, a sidewall of the shortened conductive structure 171e and the top surface of the mask layer 152 are exposed by the void 176e. In some embodiments, the bottommost region of the void 176e is lower than the bottommost portion of the conductive structure 178e. The processes and materials for forming the shortened conductive structure 171e and the conductive structure 178e may be the same as those for forming the shortened conductive structure 171 and the conductive structure 178 described above and are not repeated herein.

FIGS. 11A and 11B illustrate cross-sectional views of manufacturing a semiconductor structure 100f in accordance with some embodiments. The semiconductor structure 100f may be the same as the semiconductor structure 100, except its shortened conductive structure 171f is higher than the shortened conductive structure 171 in accordance with some embodiments. Materials and processes for manufacturing the semiconductor structure 100f may be similar to, or the same as, those for manufacturing the semiconductor structure 100 described above and are not repeated herein.

More specifically, the processes shown in FIGS. 1A to 1E, 2A-1 to 2L-1, and 1A-2 to 2L-2 may be performed to form a conductive structure (e.g. the conductive structure 170 shown in FIG. 2L-1). Next, the conductive structure is shortened to form a shortened conductive structure 171f, and the top surface of the shorted conductive structure 171f is higher than the top surface of the etch stop layer 162, as shown in FIG. 11A in accordance with some embodiments.

Next, the processes shown in FIGS. 2N-1 to 2P-1 and 2N-2 to 2P-2 and described previously are performed to formed a conductive structure 178f in the semiconductor structure 100f, as shown in FIG. 11B in accordance with some embodiments. In addition, a void 176f is formed in the conductive structure 178f and is sandwiched between the shortened conductive structure 171f and the contact 156 in accordance with some embodiments. Since the sidewall of the etch stop layer 162 is completely covered by the shortened conductive structure 171f, the etch stop layer 162 can be protected during the etching process for forming the second trench, and therefore the risk of short circuit between the conductive structure 178f and the neighboring contact 156 (e.g. the contact in the right shown in FIG. 11B) can be reduced.

The processes and materials for forming the shortened conductive structure 171f and the conductive structure 178f may be the same as those for forming the shortened conductive structure 171 and the conductive structure 178 described above and are not repeated herein.

FIGS. 12A and 12B illustrate cross-sectional views of manufacturing a semiconductor structure 100g in accordance with some embodiments. The semiconductor structure 100g may be the same as the semiconductor structure 100, except its shortened conductive structure 171g is lower than the shortened conductive structure 171 in accordance with some embodiments. Materials and processes for manufacturing the semiconductor structure 100g may be similar to, or the same as, those for manufacturing the semiconductor structure 100 described above and are not repeated herein.

More specifically, the processes shown in FIGS. 1A to 1E, 2A-1 to 2L-1, and 1A-2 to 2L-2 may be performed to form a conductive structure (e.g. the conductive structure 170 shown in FIG. 2L-1). Next, the conductive structure is shortened to form a shortened conductive structure 171g, and the top surface of the shorted conductive structure 171g is lower than the top surface of the etch stop layer 162 as shown in FIG. 12A in accordance with some embodiments.

Next, the processes shown in FIGS. 2N-1 to 2P-1 and 2N-2 to 2P-2 and described previously are performed to formed a conductive structure 178g in the semiconductor structure 100g, as shown in FIG. 12B in accordance with some embodiments. In addition, a void 176g is formed in the conductive structure 178g and is also sandwiched between the shortened conductive structure 171g and the contact 156 in accordance with some embodiments. Since the sidewall of the etch stop layer 162 is partially covered by the shortened conductive structure 171g, the etch stop layer 162 can still be protected during the etching process and the lateral etching of the etch stop layer 162 can be reduced.

The processes and materials for forming the shortened conductive structure 171g and the conductive structure 178g may be the same as those for forming the shortened conductive structure 171 and the conductive structure 178 described above and are not repeated herein.

It should be appreciated that the semiconductor structures 100a to 100g having the shortened conductive structure 171a to 171g and the conductive structure 178a to 178g described above may also be applied to FinFET structures, similar to that shown in FIG. 5, although not shown in the figures.

Generally, a conductive structure may be formed to connect a gate structure and a contact over S/D structure. However, as the device size shrank down, the conductive structure may need to be formed in a relatively small trench. In some cases, a bottom-up deposition may be performed to fill the conductive material in the small trench, so that less air gaps will be formed in the trench. However, since the contact may be much higher than the gate structure, when the conductive materials formed in the trench, the conductive material formed over the contact may block the opening of the trench first, such that the conductive material over the gate structure (i.e. at deeper portion of the trench) may not be completely filled yet. That is, the contact and the gate structure may not be well-connected.

Accordingly, a first conductive structure (e.g. the conductive structure 170) is formed over the gate structure 142 first, and an upper portion of the conductive structure is removed to form a shortened conductive structure (e.g. the shortened conductive structure 171 and 171a to 171g) in accordance with some embodiments. By forming the shortened conductive structure, the second conductive structure (e.g. the conductive structure 178 and 178a to 178g) formed afterwards can be formed by a bottom-up deposition without worrying the blocking issues due to the relatively great height difference described above. In addition, since the shortened conductive structure and the second conductive structure formed afterwards may both be formed by performing bottom-up depositions, the filling of the trench may be improved and the performance of the resulting semiconductor structure (e.g. the semiconductor structure 100, 100a to 100g, and 200) may therefore also be improved.

It should be noted that same elements in FIGS. 1A to 12B may be designated by the same numerals and may include similar or the same materials and may be formed by similar or the same processes; therefore such redundant details are omitted in the interest of brevity. In addition, although FIGS. 1A to 12B are described in relation to the method, it will be appreciated that the structures disclosed in FIGS. 1A to 12B are not limited to the method but may stand alone as structures independent of the method. Similarly, although the methods shown in FIGS. 1A to 12B are not limited to the disclosed structures but may stand alone independent of the structures. Furthermore, the nanostructures described above may include nanowires, nanosheets, or other applicable nanostructures in accordance with some embodiments.

Also, while disclosed methods are illustrated and described below as a series of acts or events, it will be appreciated that the illustrated ordering of such acts or events may be altered in some other embodiments. For example, some acts may occur in different orders and/or concurrently with other acts or events apart from those illustrated and/or described above. In addition, not all illustrated acts may be required to implement one or more aspects or embodiments of the description above. Further, one or more of the acts depicted above may be carried out in one or more separate acts and/or phases.

Furthermore, the terms "approximately," "substantially," "substantial" and "about" describe above account for small variations and may be varied in different technologies and be in the deviation range understood by the skilled in the art. For example, when used in conjunction with an event or circumstance, the terms can refer to instances in which the event or circumstance occurs precisely as well as instances in which the event or circumstance occurs to a close approximation.

Embodiments for forming semiconductor structures may be provided. The semiconductor structure may include forming a gate structure, a source/drain structure adjacent to the gate structure, and a contact over the source/drain structure. A first conductive structure may be formed over the gate structure, and the upper portion of the first conductive structure may be removed afterwards. A second conductive structure may be formed over the contact and the first conductive structure. Since the height difference between the shortened first conductive structure and the contact is relatively small, the second conductive structure may be better formed and the performance of the semiconductor structure may be improved.

In some embodiments, a method for manufacturing a semiconductor structure is provided. The method for manufacturing the semiconductor structure includes forming a gate structure over a substrate and forming a mask layer covering the gate structure. The method for manufacturing the semiconductor structure also includes forming a source/drain structure adjacent to the gate structure over the substrate and forming a contact over the source/drain structure. The method for manufacturing the semiconductor structure also includes forming a dielectric layer over the contact and the mask layer and forming a first trench through the dielectric layer and the mask layer over the gate structure. The method for manufacturing the semiconductor structure also includes forming a first conductive structure in the first trench and removing the upper portion of the first conductive structure. The method for manufacturing the semiconductor structure also includes forming a second conductive structure through the dielectric layer and covering the contact and the first conductive structure.

In some embodiments, a method for manufacturing a semiconductor structure is provided. The method for manufacturing the semiconductor structure includes forming nanostructures over a substrate and forming a gate structure wrapping around the nanostructures. The method for manufacturing the semiconductor structure also includes forming a source/drain structure attached to the nanostructures adjacent to the gate structure and forming a contact landing on the source/drain structure. The method for manufacturing the semiconductor structure also includes forming a dielectric layer over the contact and the gate structure and forming a first conductive structure through the dielectric layer and covering the gate structure. The method for manufacturing the semiconductor structure also includes etching an upper portion of the first conductive structure so that a top surface of the first conductive structure becomes lower than a top surface of the dielectric layer and forming a second conductive structure through the dielectric layer to cover both the contact and the first conductive structure.

In some embodiments, a semiconductor structure is provided. The semiconductor structure includes a substrate and a gate structure formed over the substrate. The semiconductor structure also includes a mask layer formed over the gate structure and a source/drain structure formed adjacent to the gate structure over the substrate. The semiconductor structure also includes a contact formed over the source/drain structure and a first conductive structure formed through the mask layer and landing on the gate structure. The semiconductor structure also includes a second conductive structure covering the first conductive structure and the contact. In addition, the second conductive structure includes an extending portion sandwiched between an upper portion of the first conductive structure and an upper portion of the contact.

In some embodiments, a semiconductor structure is provided. The semiconductor structure includes a substrate and nanostructures suspended over the substrate. The semiconductor structure also includes a gate structure wrapping around the nanostructures and a source/drain structure attached to the nanostructures. The semiconductor structure also includes a contact vertically over the source/drain structure and a first conductive structure vertically over the gate structure. The semiconductor structure also includes a second conductive structure in contact with a top surface of the first conductive structure and a top surface of the contact and including an extending portion laterally sandwiched between the first conductive structure and the contact.

In some embodiments, a semiconductor structure is provided. The semiconductor structure includes a first source/drain structure and a second source/drain structure formed over a substrate and nanostructures suspended over the substrate. In addition, the nanostructures are spaced apart from each other in a first direction and interpose the first source/drain structure and the second source/drain structure in a second direction different from the first direction. The semiconductor structure also includes a contact landing on the first source/drain structure and a gate structure wrapping around the nanostructures and extending along a third direction different from the first direction and the second direction. The semiconductor structure also includes a first conductive structure formed over the gate structure and a second conductive structure extending into a space between the first conductive structure and the contact along the first direction. In addition, a top surface of the second conductive structure is higher than a top surface of the contact, and a bottom surface of the second conductive structure is lower than the top surface of the contact.

In some embodiments, a semiconductor structure is provided. The semiconductor structure includes a gate structure formed in a channel region of a substrate and a gate spacer covering a sidewall of the gate structure. The semiconductor structure also includes a mask layer formed over the gate structure and the gate spacer and a first conductive structure formed through the mask layer. The semiconductor structure also includes a second conductive structure formed adjacent to the first conductive structure and a contact formed over a source/drain region of the substrate. In addition, the gate spacer is laterally sandwiched between a first portion of the contact and the gate structure, the mask layer is laterally sandwiched between a second portion of the contact and the first conductive structure, the second conductive structure is laterally sandwiched between a third portion of the contact and the first conductive structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   nanostructures suspended over the substrate;
   a gate structure wrapping around the nanostructures;
   a source/drain structure attached to the nanostructures;
   a contact vertically over the source/drain structure;
   a first conductive structure vertically over the gate structure; and
   a second conductive structure in contact with a top surface of the first conductive structure and a top surface of the contact and comprising an extending portion laterally sandwiched between the first conductive structure and the contact.

2. The semiconductor structure as claimed in claim 1, wherein a void is embedded in the extending portion of the second conductive structure.

3. The semiconductor structure as claimed in claim 1, further comprising:
   a mask layer laterally sandwiched between the contact and the first conductive structure and directly under the second conductive structure.

4. The semiconductor structure as claimed in claim 3, further comprising:
   a gate spacer covering a sidewall of the gate structure, wherein the mask layer is vertically sandwiched between the gate spacers and the second conductive structure.

5. The semiconductor structure as claimed in claim 3, wherein the mask layer is spaced apart from the extending portion of the second conductive structure by a void.

6. The semiconductor structure as claimed in claim 1, wherein the top surface of the first conductive structure is higher than the top surface of contact.

7. A semiconductor structure, comprising:
   a first source/drain structure and a second source/drain structure formed over a substrate;
   nanostructures suspended over the substrate, wherein the nanostructures are spaced apart from each other in a first direction and interpose the first source/drain structure and the second source/drain structure in a second direction different from the first direction;
   a contact landing on the first source/drain structure;
   a gate structure wrapping around the nanostructures and extending along a third direction different from the first direction and the second direction;
   a first conductive structure formed over the gate structure; and
   a second conductive structure extending into a space between the first conductive structure and the contact along the first direction,
   wherein a top surface of the second conductive structure is higher than a top surface of the contact, and a bottom surface of the second conductive structure is lower than the top surface of the contact.

8. The semiconductor structure as claimed in claim 7, wherein the second conductive structure has a first dimension in the second direction, the contact has a second dimension in the second direction, and the first dimension is greater than the second dimension.

9. The semiconductor structure as claimed in claim 7, further comprising:
a mask layer surrounding the first conductive structure, wherein the second conductive structure is in direct contact with the mask layer.

10. The semiconductor structure as claimed in claim 9, wherein a top surface of the mask layer is substantially level with a top surface of the contact.

11. The semiconductor structure as claimed in claim 7, further comprising:
a mask layer surrounding the first conductive structure, wherein the second conductive structure is spaced apart from the mask layer.

12. The semiconductor structure as claimed in claim 7, wherein the contact has a rounded corner.

13. The semiconductor structure as claimed in claim 7, further comprising:
a cap layer vertically sandwiched between the gate structure and the first conductive structure.

14. The semiconductor structure as claimed in claim 13, wherein the cap layer has a third dimension in the second direction, the gate structure has a fourth dimension in the second direction, and the third dimension is greater than the fourth dimension.

15. A semiconductor structure, comprising:
a gate structure formed in a channel region of a substrate;
a gate spacer covering a sidewall of the gate structure;
a mask layer formed over the gate structure and the gate spacer;
a first conductive structure formed through the mask layer;
a second conductive structure formed adjacent to the first conductive structure; and
a contact formed over a source/drain region of the substrate,
wherein the gate spacer is laterally sandwiched between a first portion of the contact and the gate structure, the mask layer is laterally sandwiched between a second portion of the contact and the first conductive structure, the second conductive structure is laterally sandwiched between a third portion of the contact and the first conductive structure.

16. The semiconductor structure as claimed in claim 15, wherein the first portion and the third portion of the contact is at opposite sides of the second portion of the contact.

17. The semiconductor structure as claimed in claim 15, wherein a top surface of the third portion of the contact is lower than both a top surface of the second conductive structure and a top surface of the first conductive structure.

18. The semiconductor structure as claimed in claim 15, further comprising:
a liner layer covering a sidewall of the gate spacer and a sidewall of the mask layer and in direct contact with the second conductive structure.

19. The semiconductor structure as claimed in claim 15, further comprising:
a cap layer formed over the gate structure, wherein an interface between the first conductive structure and the cap layer is lower than a top surface of the gate spacer.

20. The semiconductor structure as claimed in claim 15, wherein a void is laterally sandwiched between the third portion of the contact and the first conductive structure.

* * * * *